(12) United States Patent
Chen et al.

(10) Patent No.: US 12,087,775 B2
(45) Date of Patent: Sep. 10, 2024

(54) GATE STRUCTURES IN TRANSISTOR DEVICES AND METHODS OF FORMING SAME

(71) Applicant: Taiwan Semiconductor Manufacturing Co., Ltd., Hsinchu (TW)

(72) Inventors: Ting-Gang Chen, Taipei (TW); Bo-Cyuan Lu, New Taipei (TW); Tai-Chun Huang, Hsinchu (TW); Chi On Chui, Hsinchu (TW); Chieh-Ping Wang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 267 days.

(21) Appl. No.: 17/464,369

(22) Filed: Sep. 1, 2021

(65) Prior Publication Data

US 2023/0008494 A1    Jan. 12, 2023

Related U.S. Application Data

(60) Provisional application No. 63/219,416, filed on Jul. 8, 2021.

(51) Int. Cl.
*H01L 27/00* (2006.01)
*H01L 21/02* (2006.01)
(Continued)

(52) U.S. Cl.
CPC ...... *H01L 27/0924* (2013.01); *H01L 21/0217* (2013.01); *H01L 21/02274* (2013.01);
(Continued)

(58) Field of Classification Search
CPC ............. H01L 27/0924; H01L 21/0217; H01L 21/02274; H01L 21/0228; H01L 21/02326;
(Continued)

(56) References Cited

U.S. PATENT DOCUMENTS 9,209,247 B2   12/2015   Colinge et al.
9,236,267 B2    1/2016   De et al.
(Continued)

FOREIGN PATENT DOCUMENTS

DE    102018100297 A1    5/2019
DE    102020109494 B3    7/2021
(Continued)

*Primary Examiner* — Karen Kusumakar
*Assistant Examiner* — Adam S Bowen
(74) *Attorney, Agent, or Firm* — Slater Matsil, LLP

(57) ABSTRACT

A semiconductor device includes first transistor having a first gate stack and first source/drain regions on opposing sides of the first gate stack; a second transistor having a second gate stack and second source/drain regions on opposing sides of the second gate stack; and a gate isolation structure separating the first gate stack from the second gate stack. The gate isolation structure includes a dielectric liner having a varied thickness along sidewalls of the first gate stack and the second gate stack and a dielectric fill material over the dielectric liner, wherein the dielectric fill material comprises a seam.

20 Claims, 54 Drawing Sheets

(51) Int. Cl.
*H01L 21/764* (2006.01)
*H01L 21/8238* (2006.01)
*H01L 27/092* (2006.01)
*H01L 29/06* (2006.01)
*H01L 29/417* (2006.01)
*H01L 29/423* (2006.01)
*H01L 29/66* (2006.01)
*H01L 29/78* (2006.01)
*H01L 29/786* (2006.01)

(52) U.S. Cl.
CPC .... *H01L 21/0228* (2013.01); *H01L 21/02326* (2013.01); *H01L 21/0259* (2013.01); *H01L 21/764* (2013.01); *H01L 21/823807* (2013.01); *H01L 21/823814* (2013.01); *H01L 21/823821* (2013.01); *H01L 21/823871* (2013.01); *H01L 21/823878* (2013.01); *H01L 29/0665* (2013.01); *H01L 29/41733* (2013.01); *H01L 29/41791* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78696* (2013.01)

(58) Field of Classification Search
CPC ............... H01L 21/0259; H01L 21/764; H01L 21/823807; H01L 21/823814; H01L 21/823821; H01L 21/823871; H01L 21/823878; H01L 29/0665; H01L 29/41733; H01L 29/41791; H01L 29/42392; H01L 29/66545; H01L 29/66742; H01L 29/66795; H01L 29/7851; H01L 29/78696; H01L 21/823437; H01L 27/1203; H01L 21/0234; H01L 21/823431; H01L 21/823481; H01L 27/0886; H01L 29/0673; H01L 29/165; H01L 29/66439; H01L 29/7848; H01L 29/775; H01L 27/0928; H01L 29/785; B82Y 10/00

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,532,479 | B2 | 12/2022 | Chen et al. |
| 2011/0198675 | A1 | 8/2011 | Ng et al. |
| 2011/0215412 | A1* | 9/2011 | Pei .............. H01L 29/517 257/E21.135 |
| 2017/0025511 | A1 | 1/2017 | Lee et al. |
| 2018/0090493 | A1* | 3/2018 | Kwak ............ H01L 29/785 |
| 2019/0139957 | A1 | 5/2019 | Liao et al. |
| 2019/0148214 | A1 | 5/2019 | Chang et al. |
| 2019/0148219 | A1* | 5/2019 | Yen ............ H01L 27/1218 257/347 |
| 2019/0355823 | A1* | 11/2019 | Lin ............ H01L 29/7856 |
| 2019/0378903 | A1 | 12/2019 | Jeon et al. |
| 2020/0111669 | A1* | 4/2020 | Zaitsu ............ H01L 21/02164 |
| 2020/0212200 | A1 | 7/2020 | Ghani et al. |
| 2021/0313216 | A1 | 10/2021 | Chang et al. |
| 2021/0407807 | A1 | 12/2021 | Wang et al. |
| 2022/0013630 | A1* | 1/2022 | Park ............ H01L 29/6656 |

FOREIGN PATENT DOCUMENTS

| | | |
|---|---|---|
| DE | 102020124631 A1 | 12/2021 |
| TW | 201923906 A | 6/2019 |

\* cited by examiner

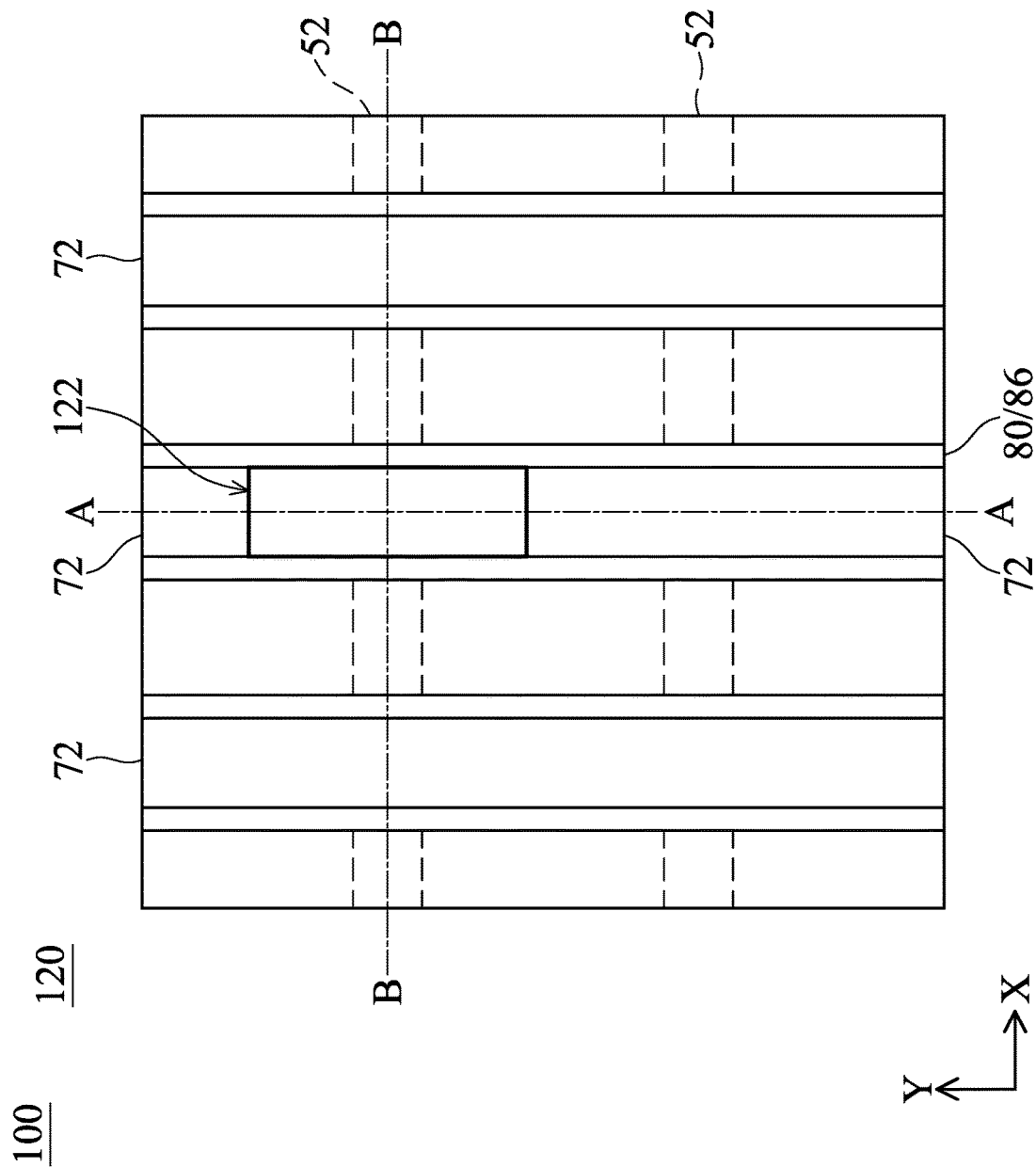

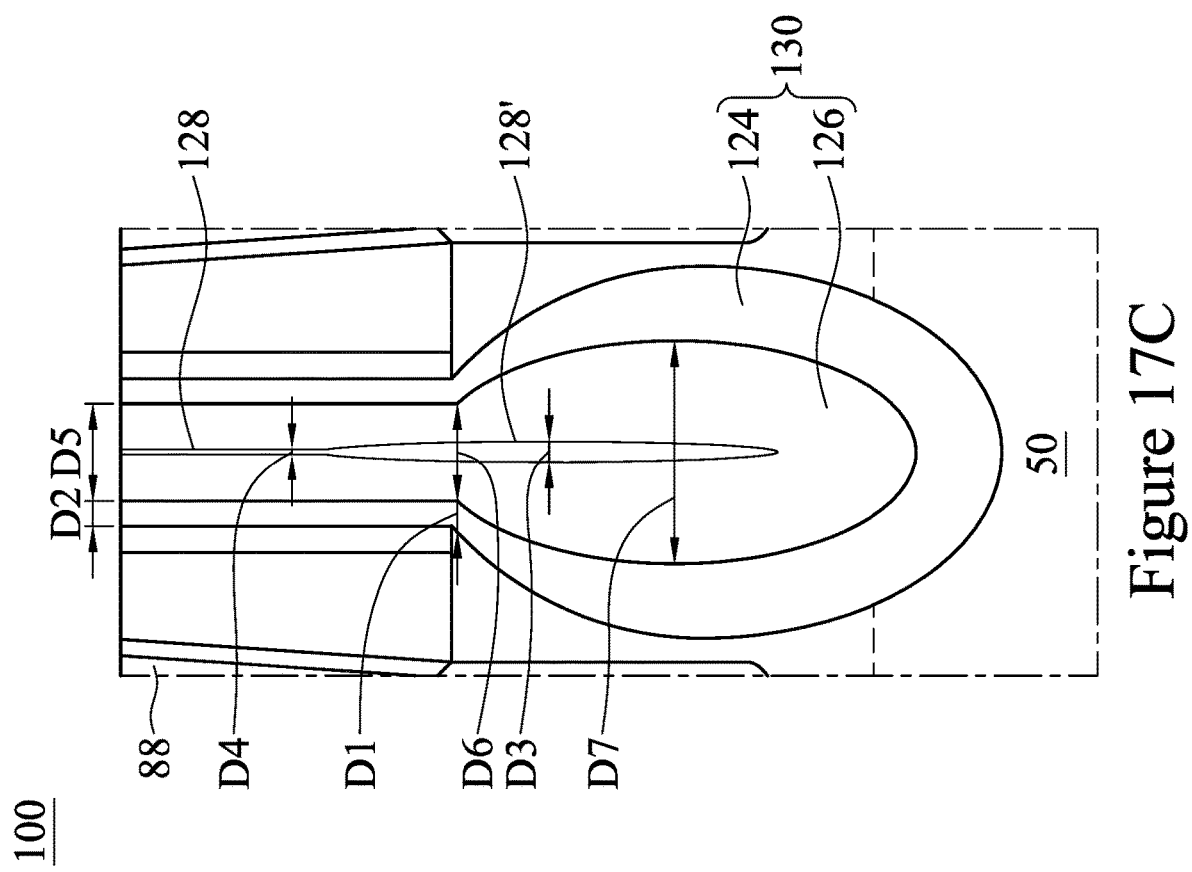

GATE STRUCTURES IN TRANSISTOR DEVICES AND METHODS OF FORMING SAME

PRIORITY CLAIM AND CROSS-REFERENCE

This application claims the benefit of U.S. Provisional Application No. 63/219,416, filed on Jul. 8, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 13C, 14A, 14B, 15A, 15B, 16A, 16B, 17A, 17B, 17C, 18A, 18B, 19A, 19B, 19C, 19D, 19E, 19F, 20A, 20B, 21A, 21B, 22A, and 22B are cross-sectional views of intermediate stages in the manufacturing of FinFETs, in accordance with some embodiments.

DETAILED DESCRIPTION

Figure 1:
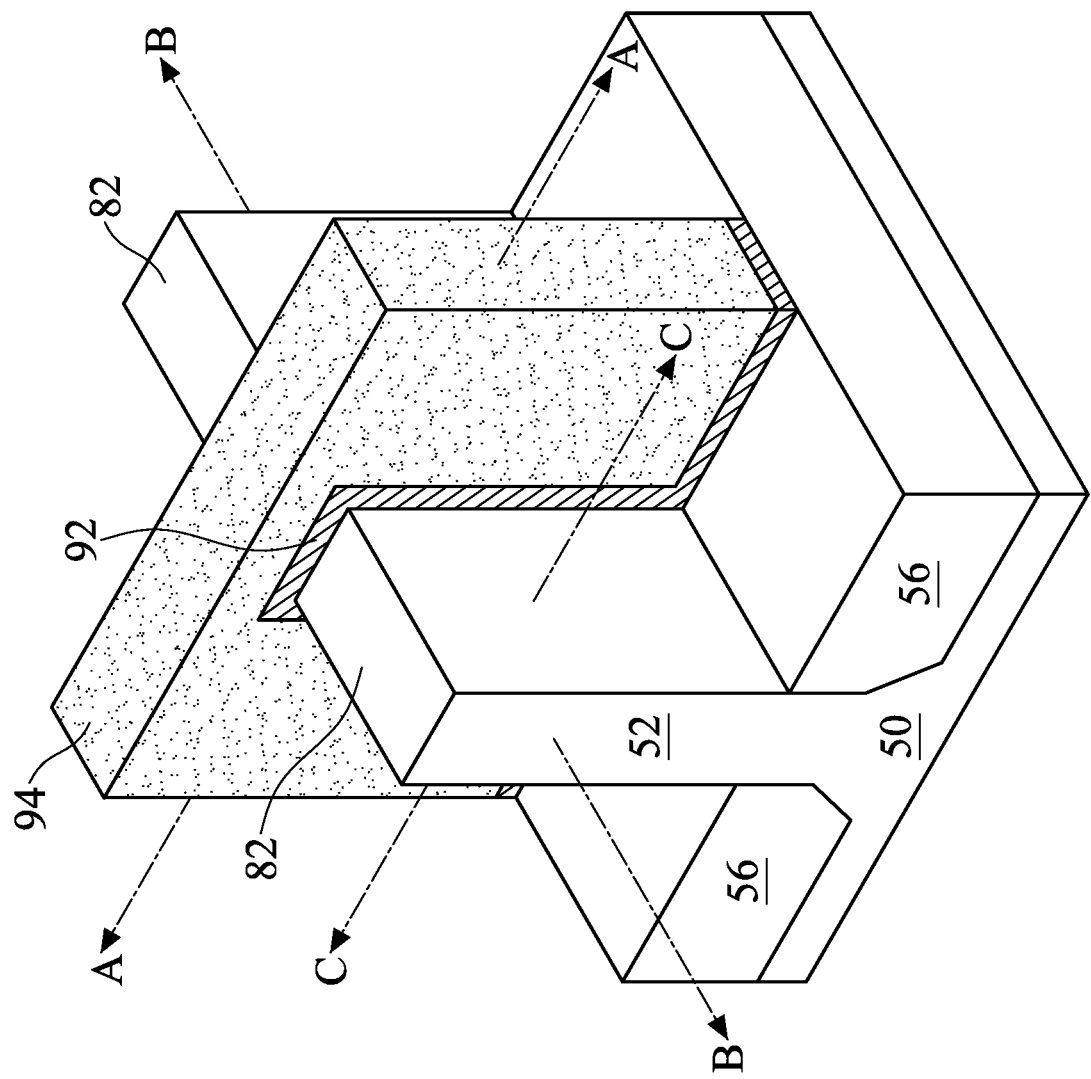
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a gate cut process is performed to separate adjacent dummy gates and define a pattern of replacement gate stacks. As part of the gate cut process, the dummy gates are etched to define an opening, and a gate isolation structure is formed in the opening. The gate isolation structure may include a dielectric liner (sometimes referred to as a spacer), which is deposited using a non-conformal deposition process with a tapered profile, and the gate isolation structure may further include a dielectric fill material that is deposited over the dielectric liner. By maintaining a tapered profile in the dielectric liner, a width at a top of the opening may remain relatively large, and a deposition window of the dielectric fill material is improved. As such, the dielectric fill material may be formed with fewer manufacturing errors, such as reduced seams/voids. The reduction in size/number of seams/voids may further reduce electrical defects (e.g., shorting) that might otherwise result from a conductive material being inadvertently trapped in exposed seams during subsequent processing steps (e.g., during the formation of gate or source/drain contacts).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 22B are cross-sectional views of intermediate stages in the manufacturing of FinFETs in a device 100, in accordance with some embodiments. FIGS. 2 through 7 illustrate reference cross-section A-A illustrated in FIG. 1, except for multiple fins/FinFETs and/or with gate isolation structures. FIGS. 8A, 9A, 10A, 11A, 12A, 13A, 14A, 15A, 16A, 17A, 18A, 19A, 19C, 20A, 21A, and 22A are illustrated along reference cross-section A-A illustrated in FIG. 1, and FIGS. 8B, 9B, 10B, 11B, 12B, 13B, 14B, 14C, 15B, 16B, 17B, 17C, 18B, 19B, 19D, 19E, 20B, 21B, and 22B are illustrated along a similar cross-section B-B illustrated in FIG. 1, except for multiple fins/FinFETs and/or with gate isolation structures. FIGS. 10C and 10D are illustrated along reference cross-section C-C illustrated in FIG. 1, except for multiple fins/FinFETs. FIGS. 13C and 19F illustrate top down views of gate structures in accordance with some embodiments.

Figure 2:
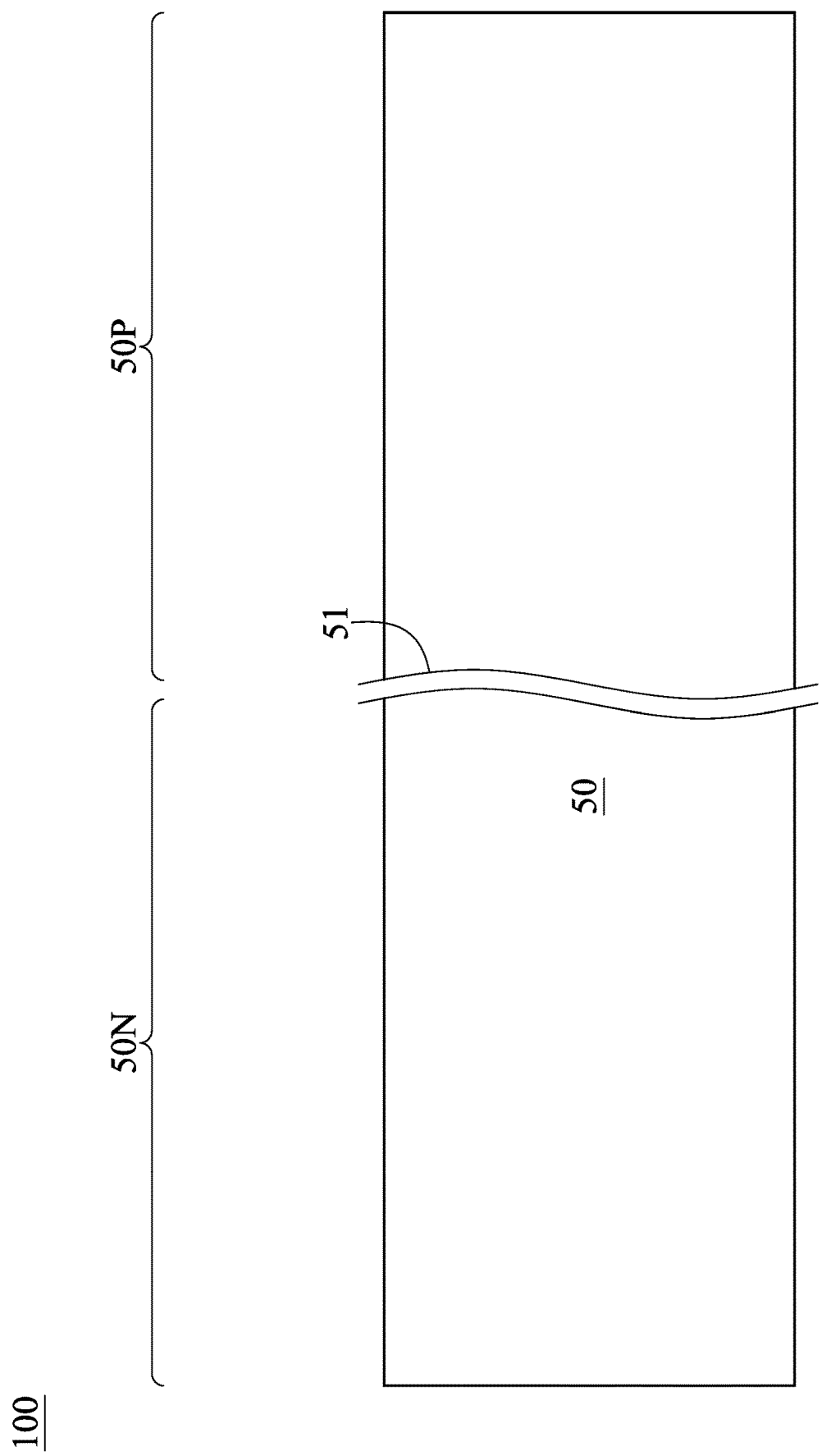

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
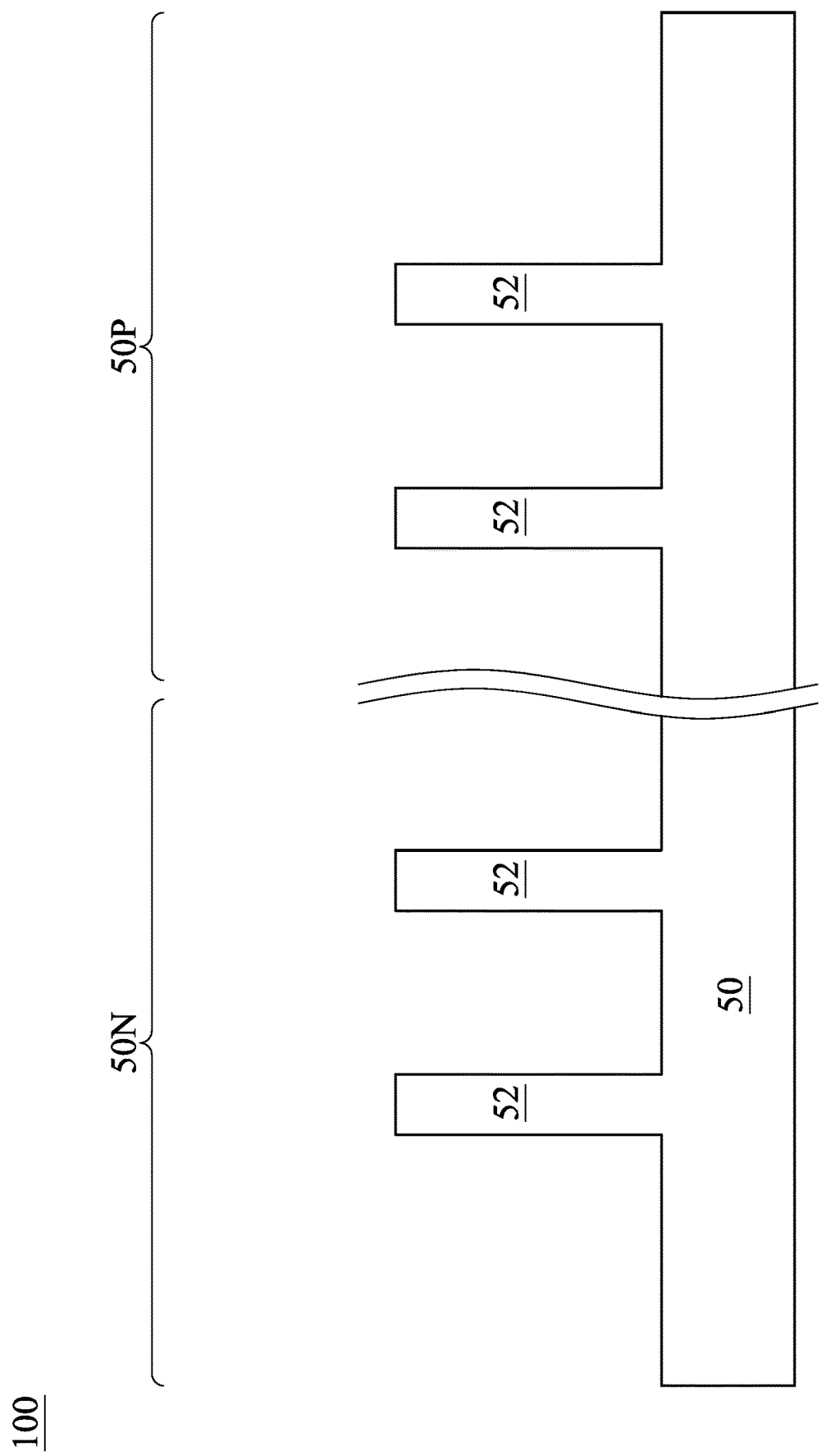

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
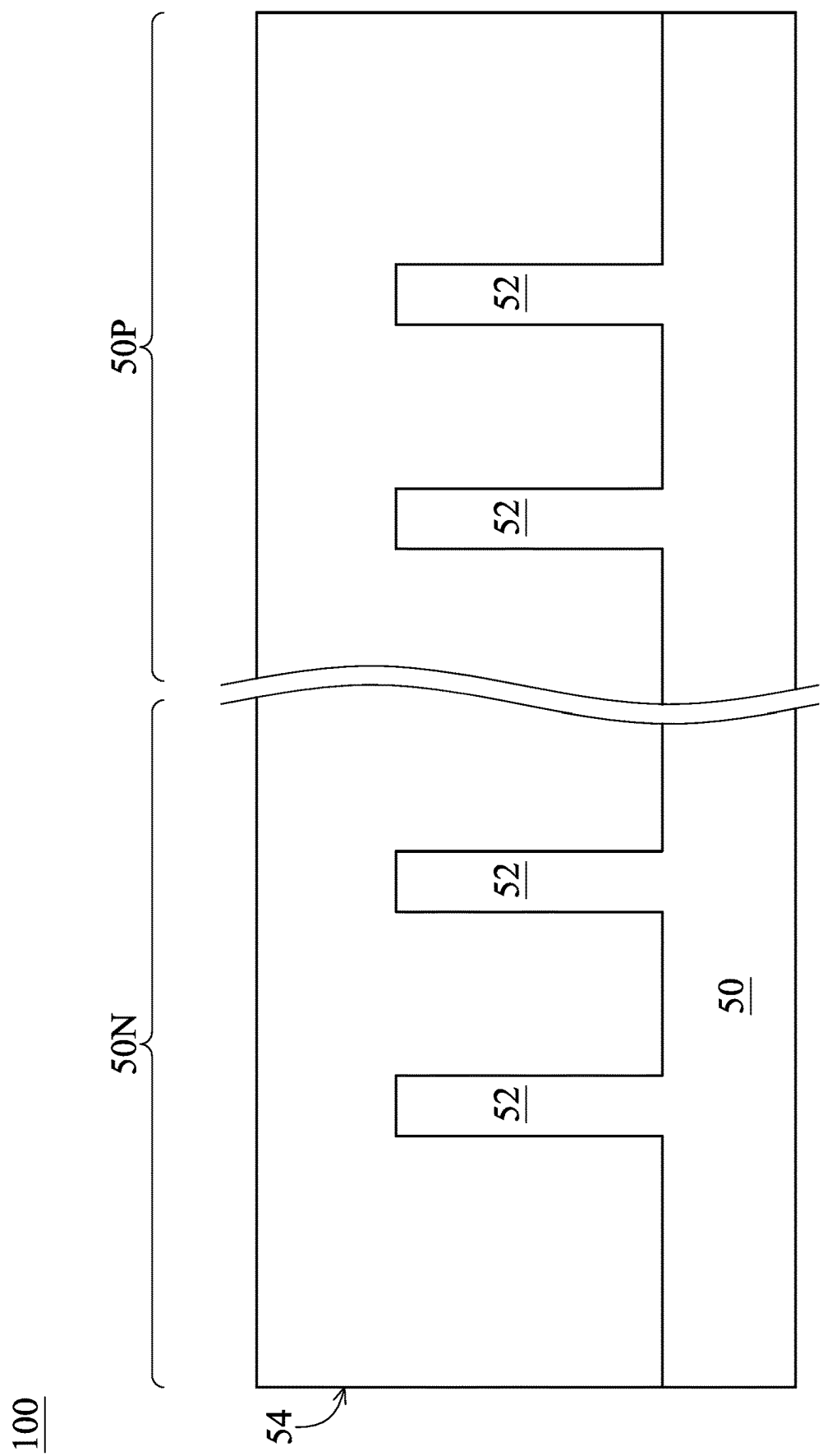

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
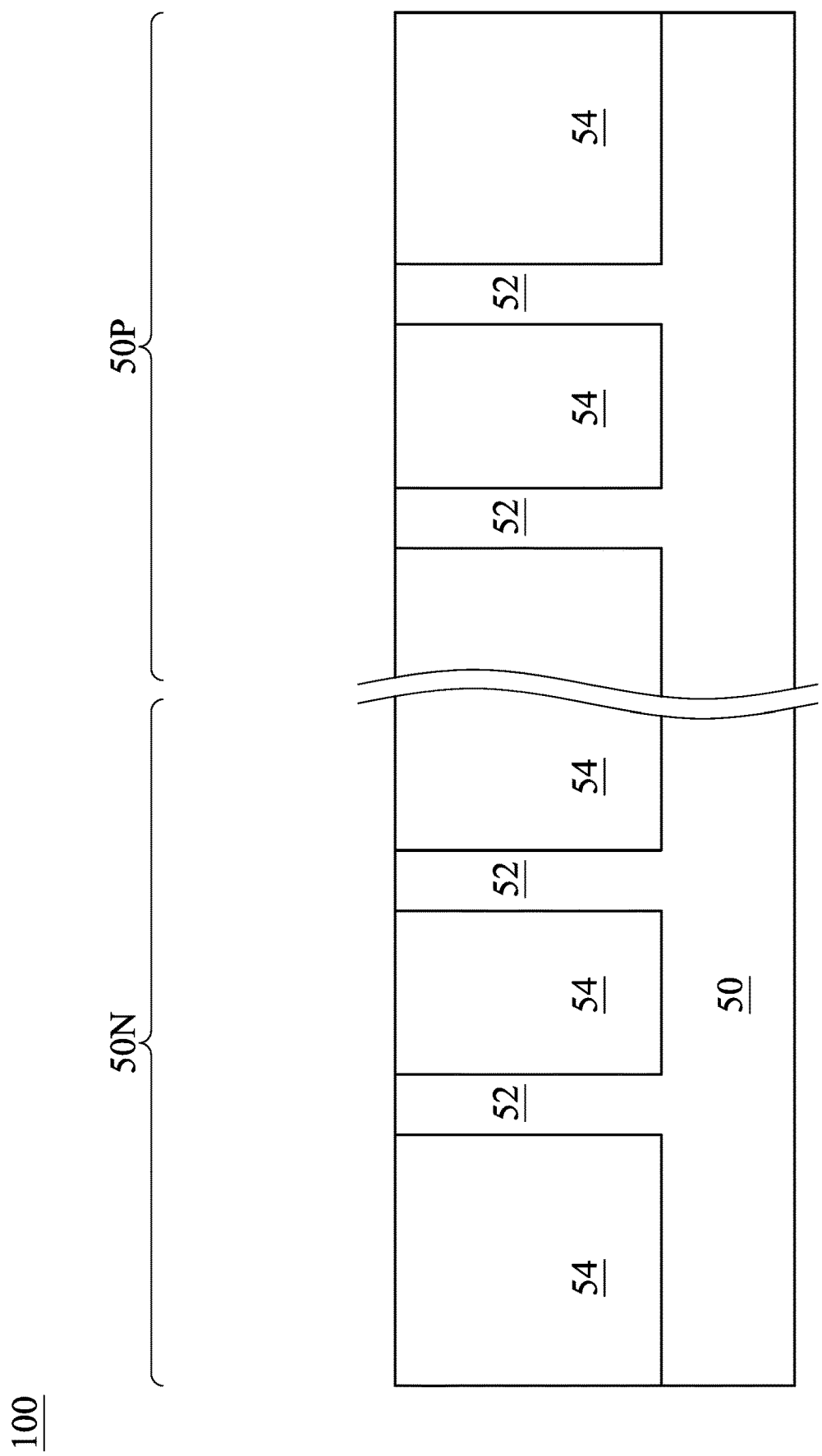

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
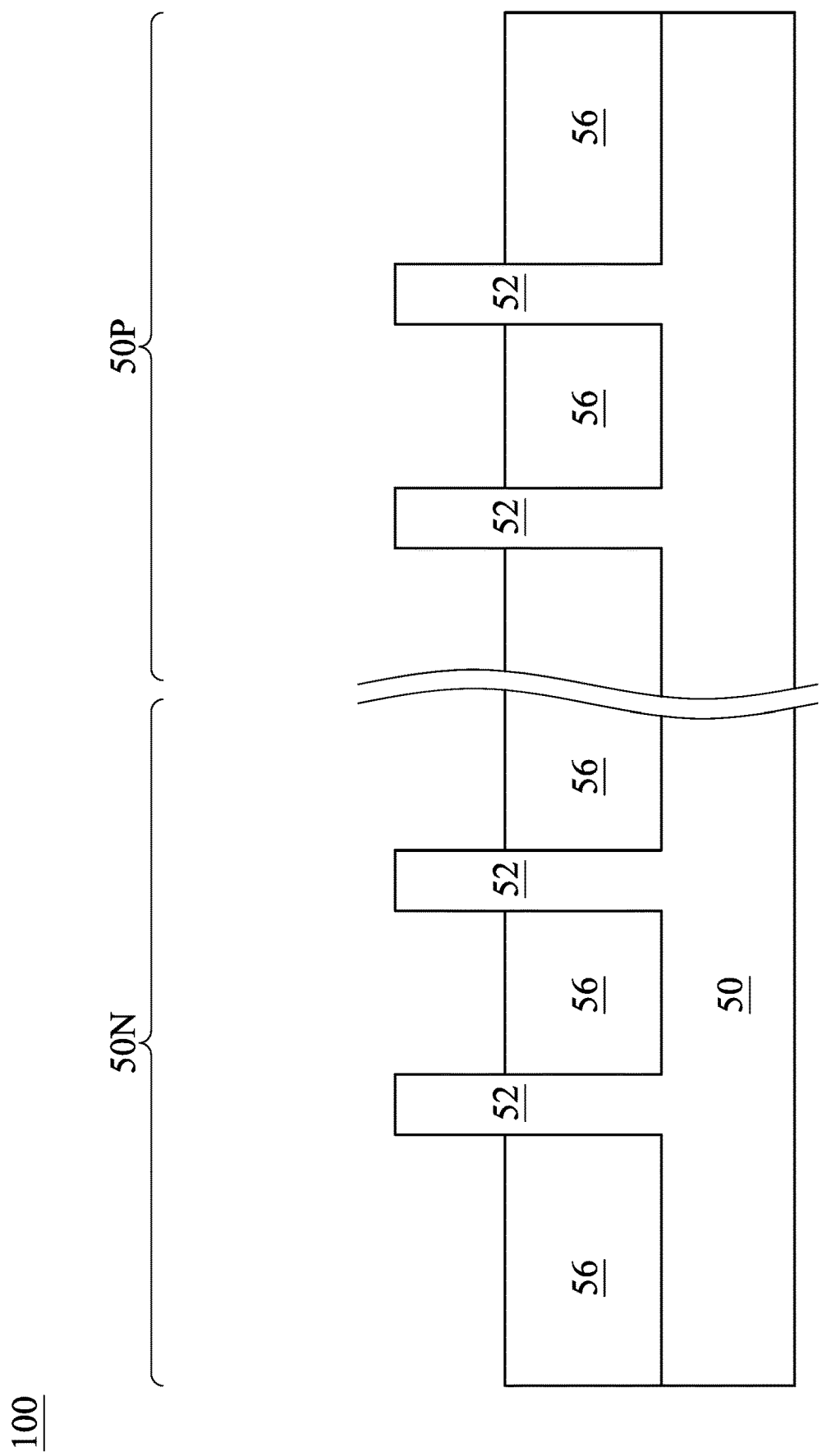

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
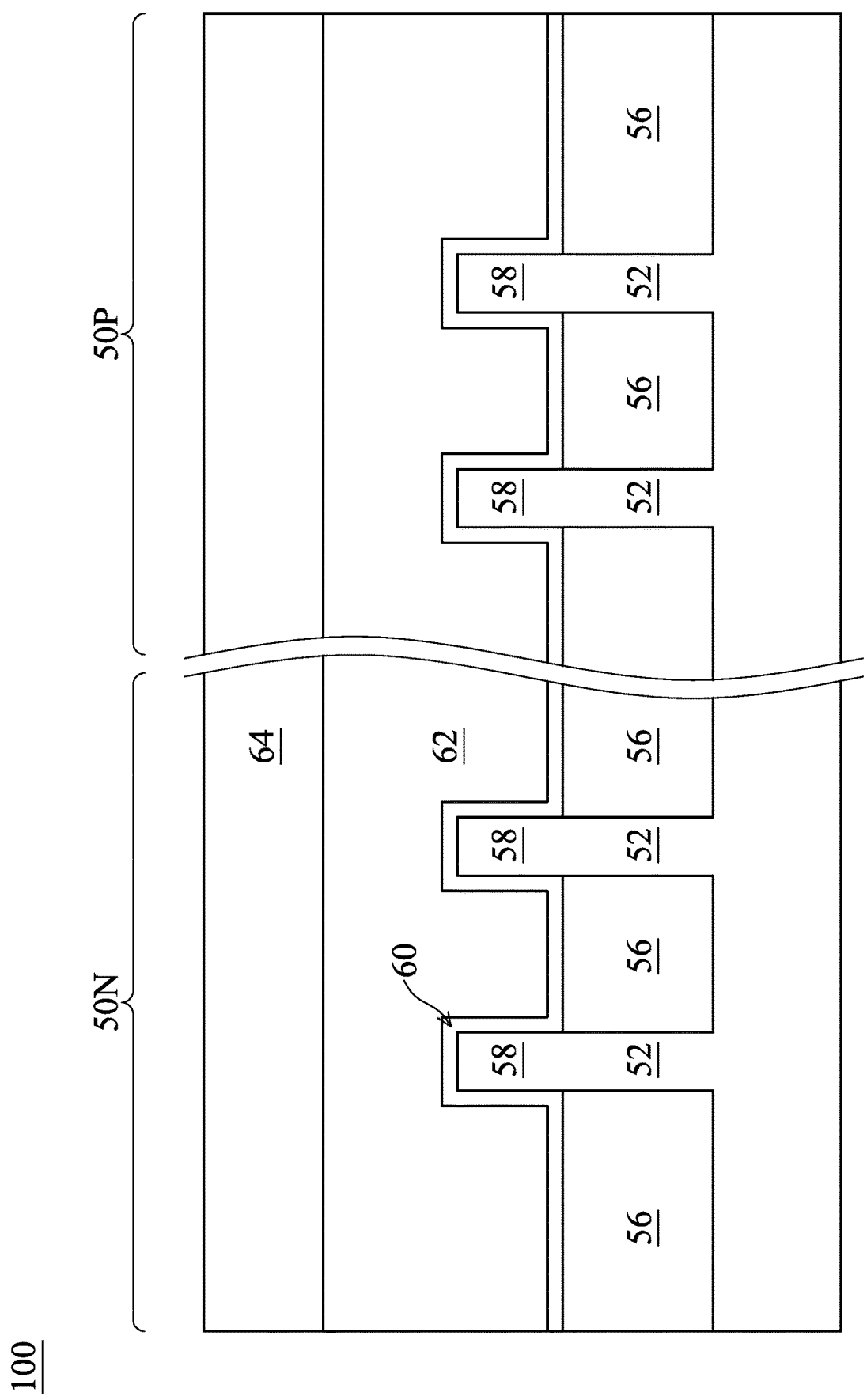

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 22B illustrate various additional steps in the manufacturing of embodiment devices. FIGS. 8A through 22B illustrate features in either of the n-type region 50N and the p-type region 50P. For example, the structures illustrated in FIGS. 8A through 22B may be applicable to both the n-type region 50N and the p-type region 50P. Differences (if any) in the structures of the n-type region 50N and the p-type region 50P are described in the text accompanying each figure.

Figure 8A:
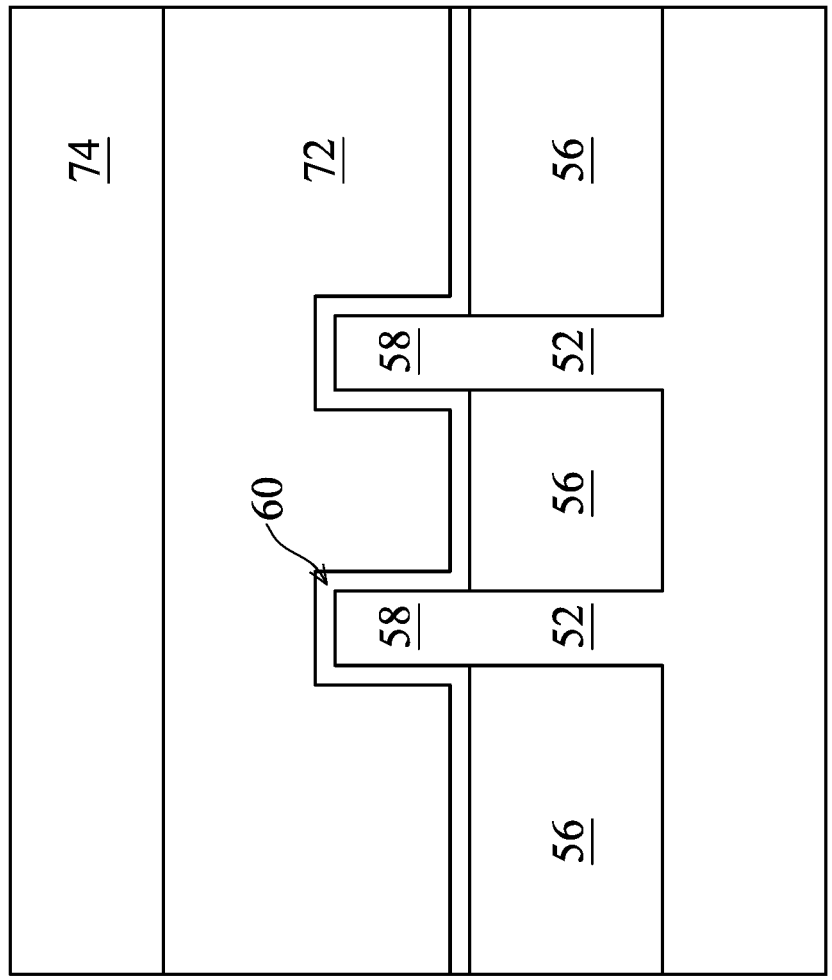
Figure 8B:
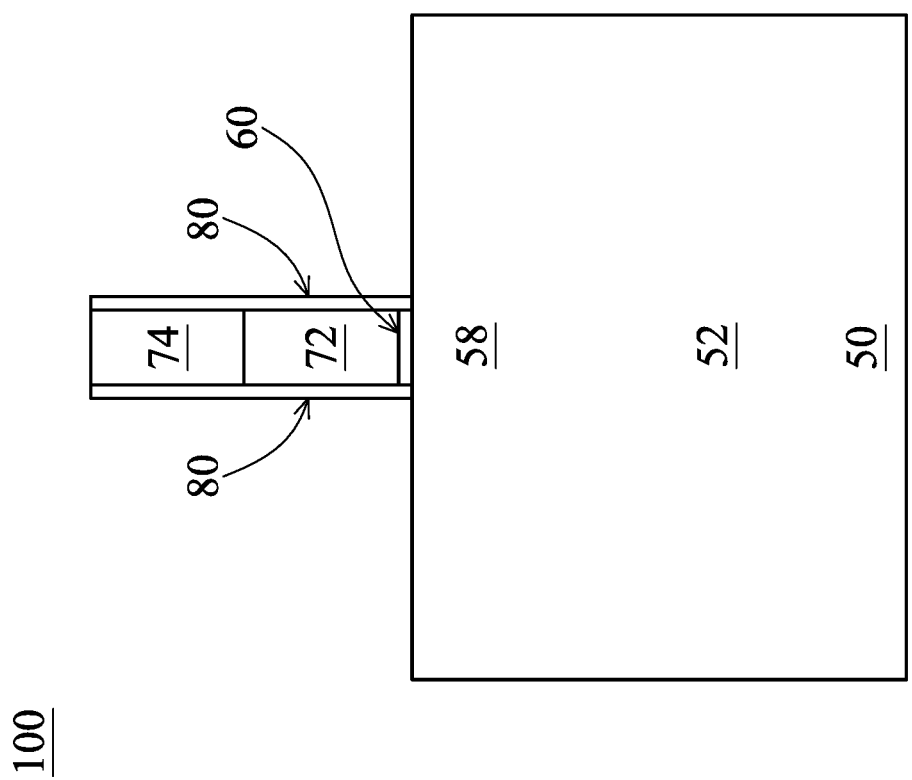

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9A:
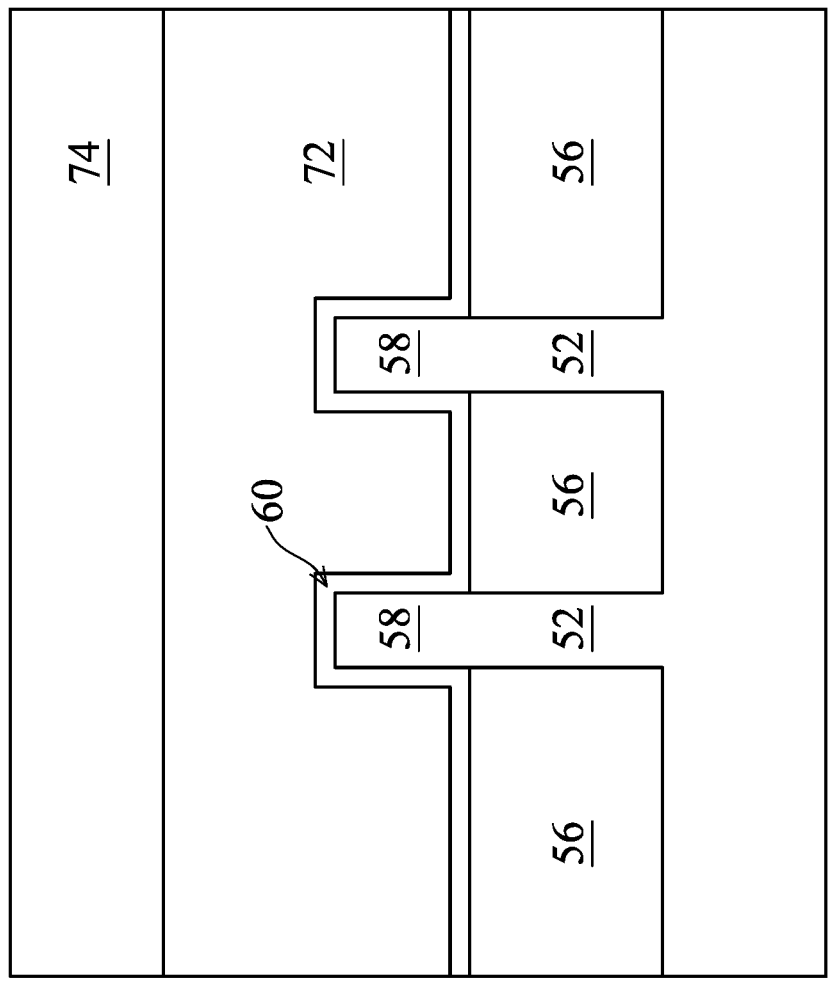
Figure 9B:
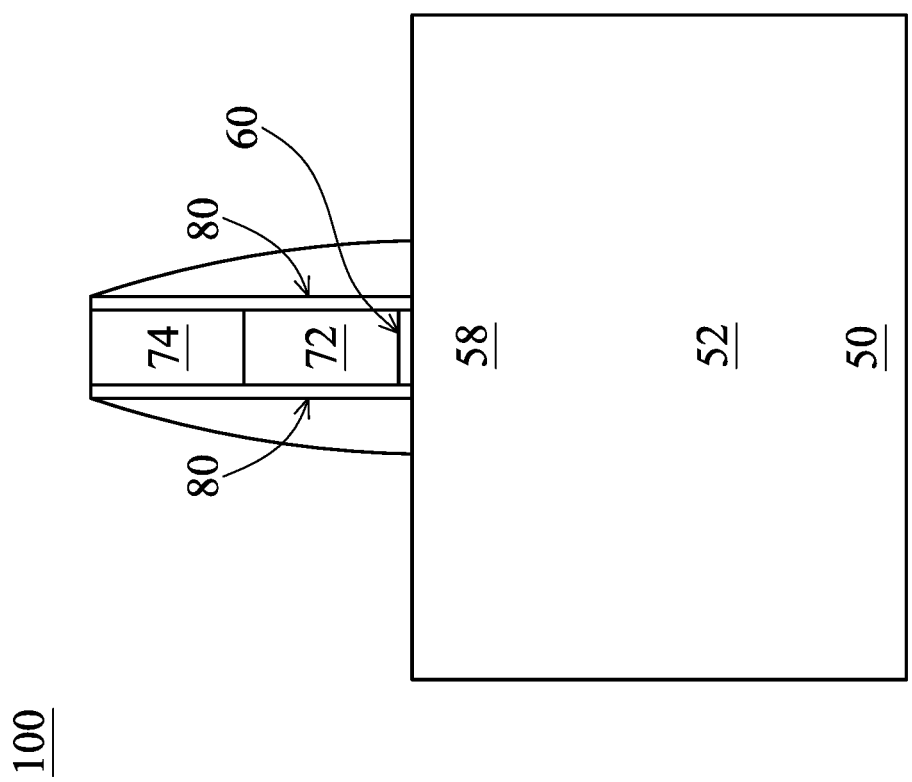

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10A:
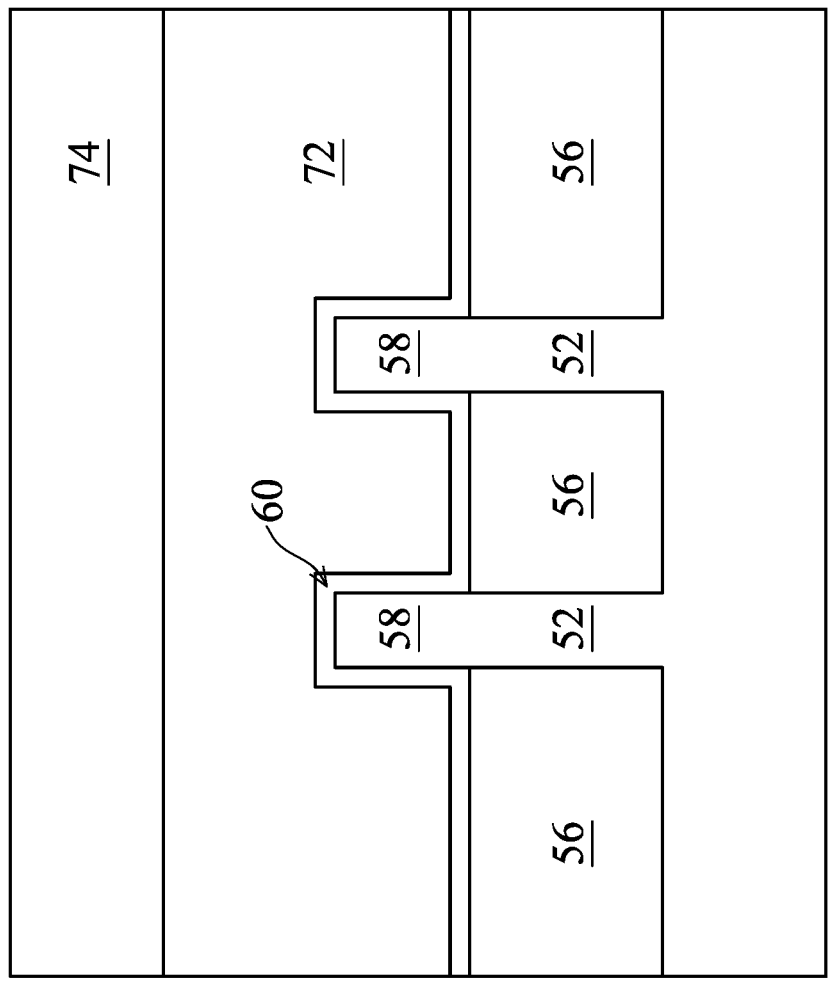
Figure 10B:
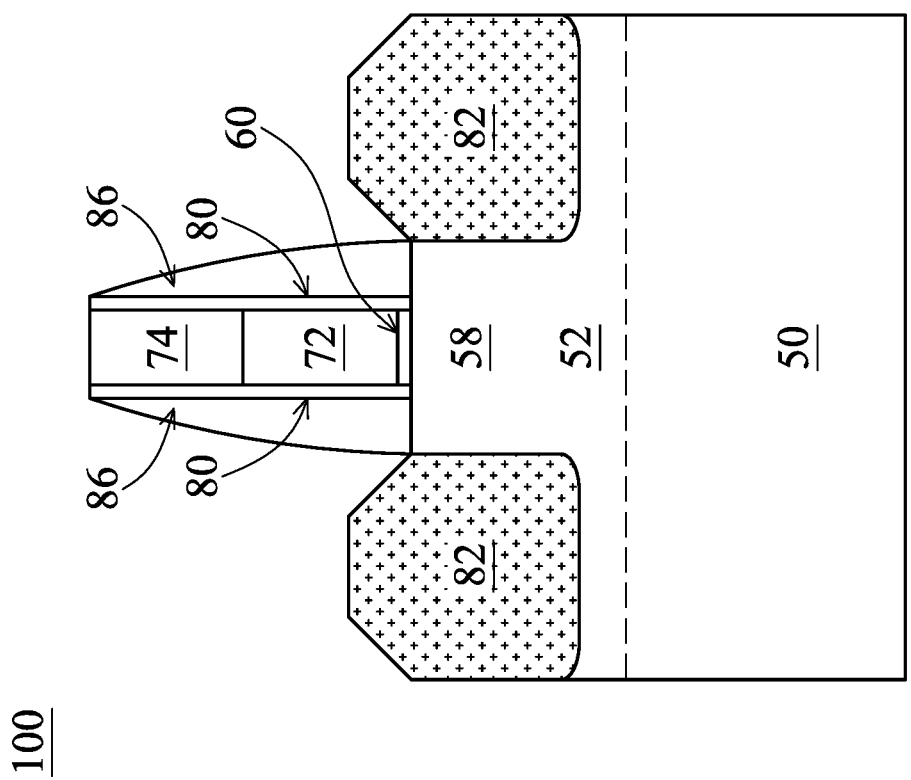
Figure 10C:
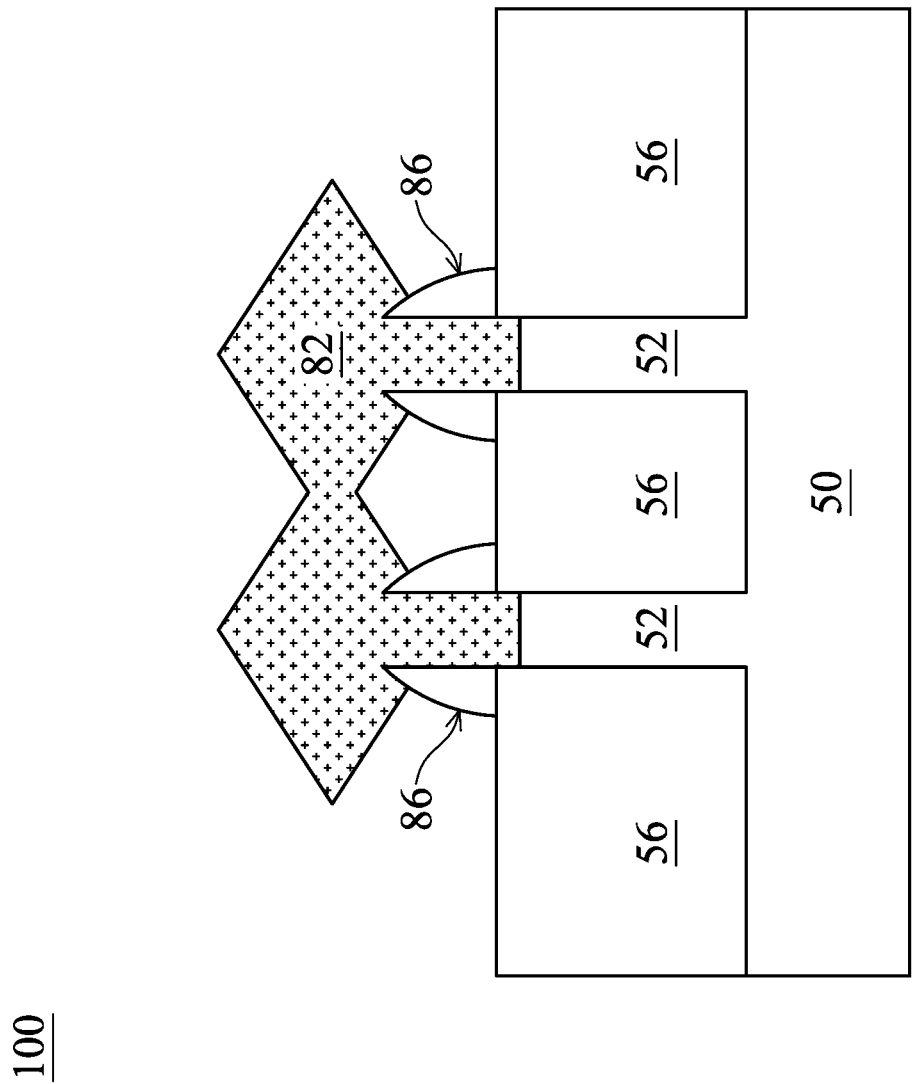
Figure 10D:
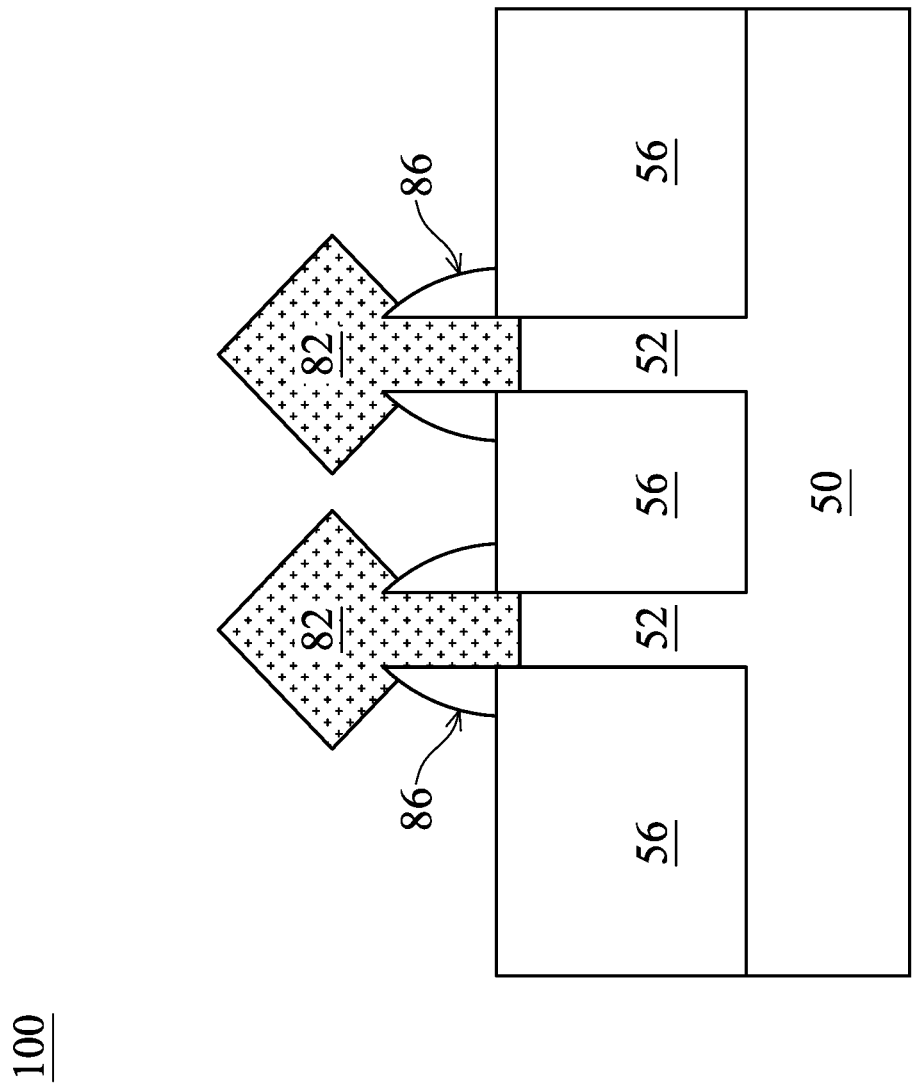

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11A:
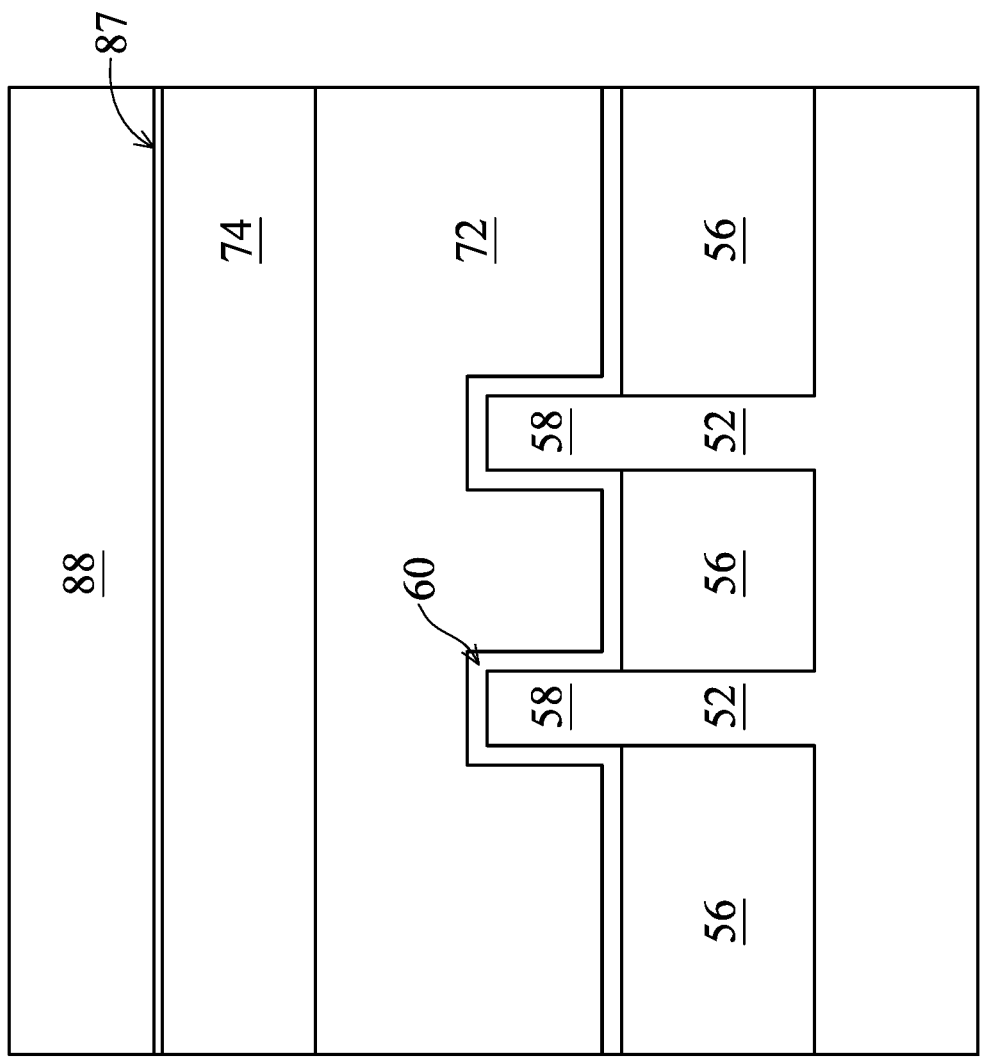
Figure 11B:
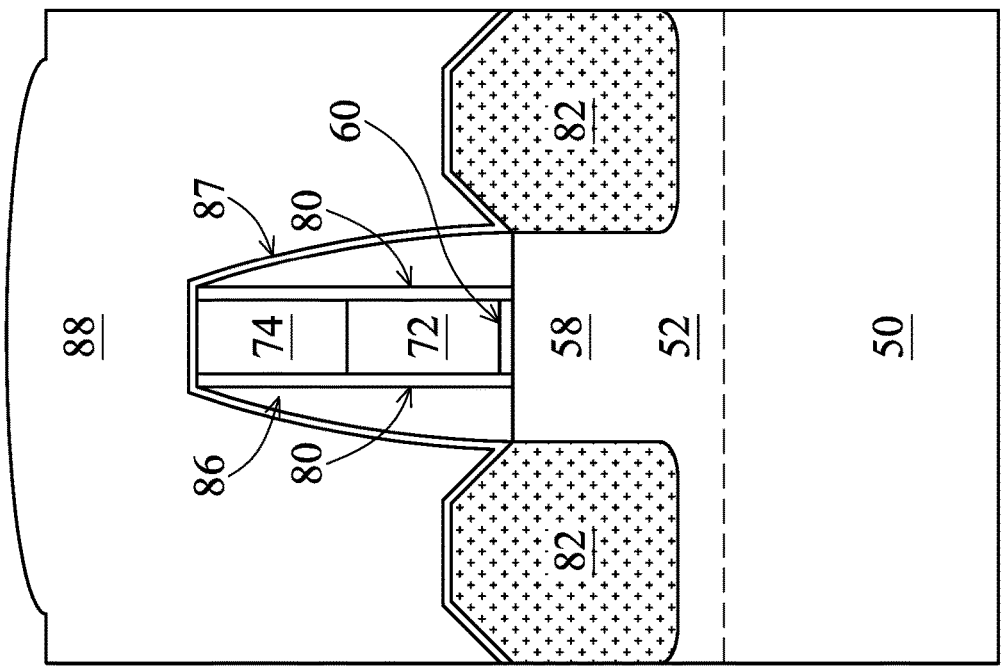

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12A:
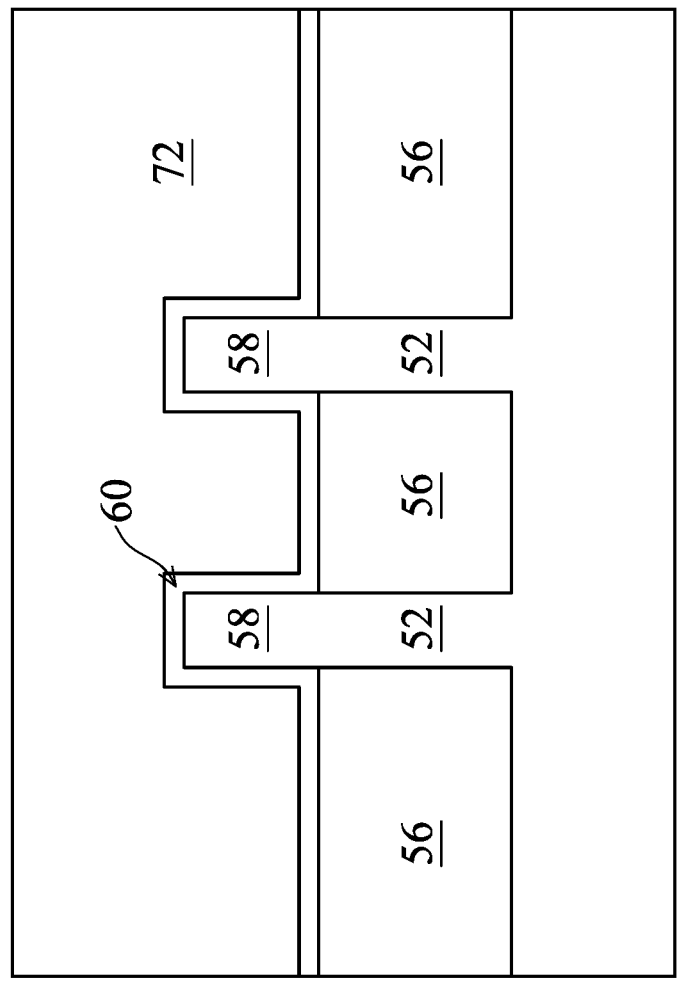
Figure 12B:
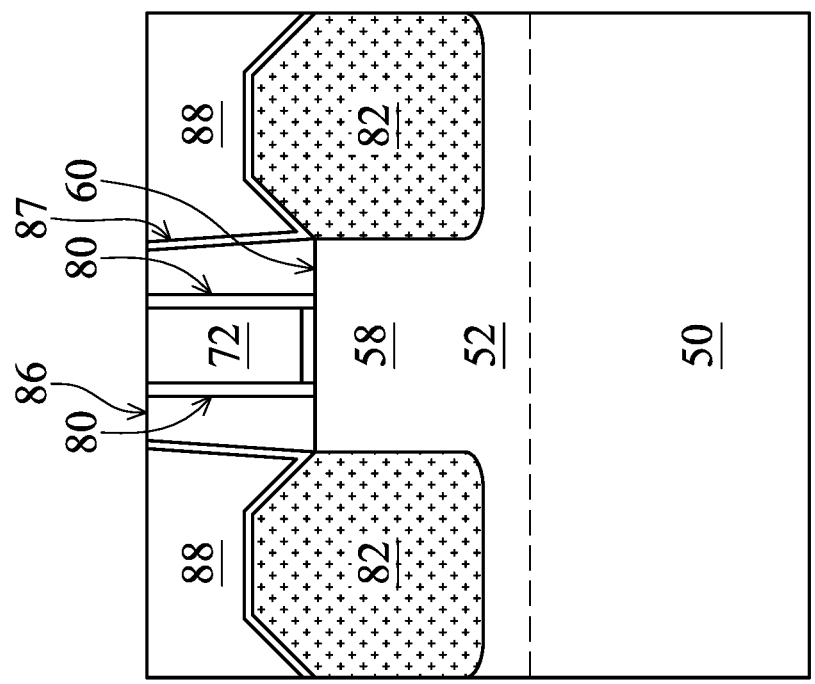
Figure 13A:
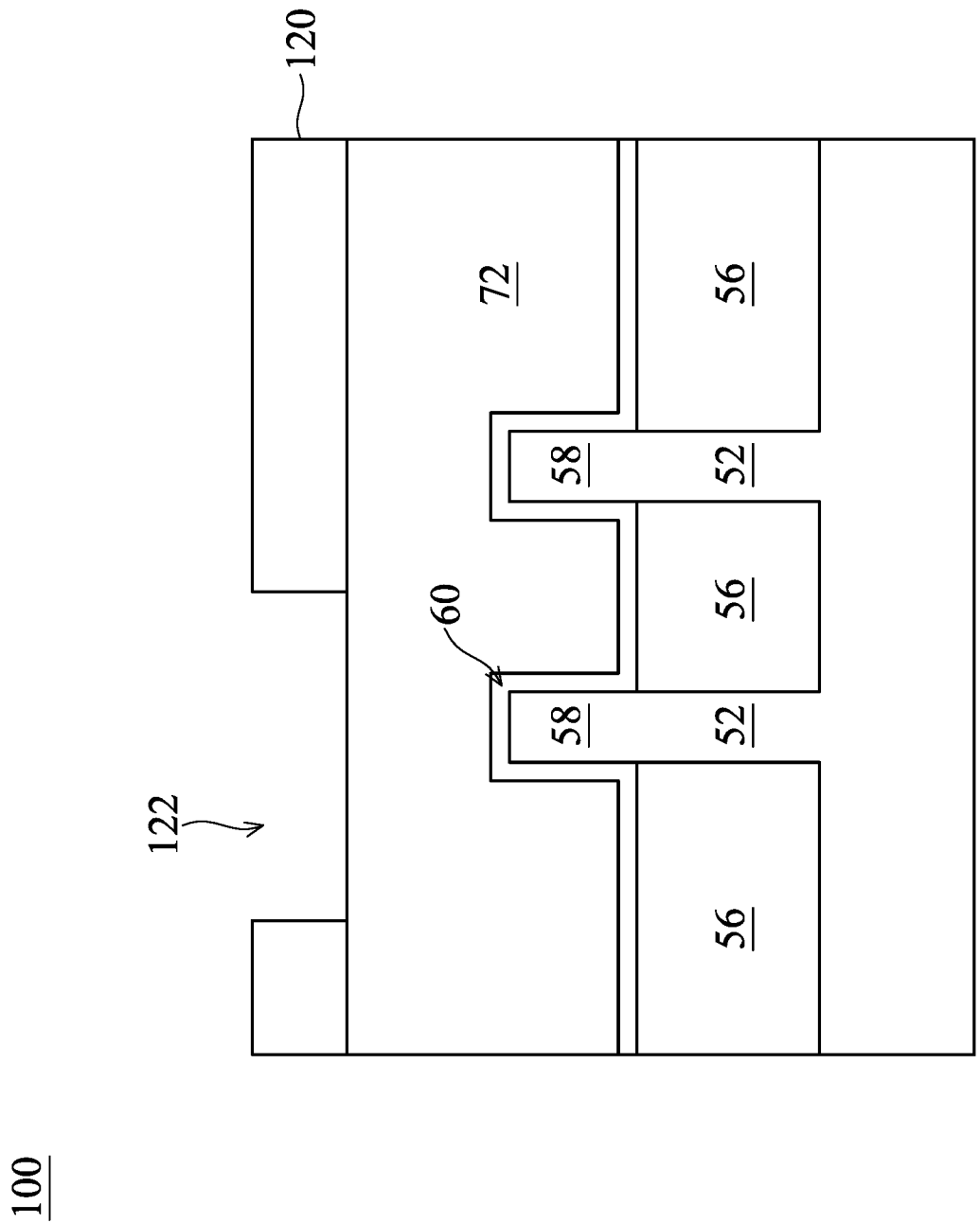

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, the CESL 87, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

In FIGS. 13A through 17C, a gate cut process is performed to form a gate isolation structure 130 (see FIGS. 17A through 17C) that extends through certain ones of the dummy gates 72, thereby separating and patterning the dummy gates 72. In various embodiments, the gate cut process may be used to define a pattern of the subsequently formed replacement gate structures.

Figure 13B:
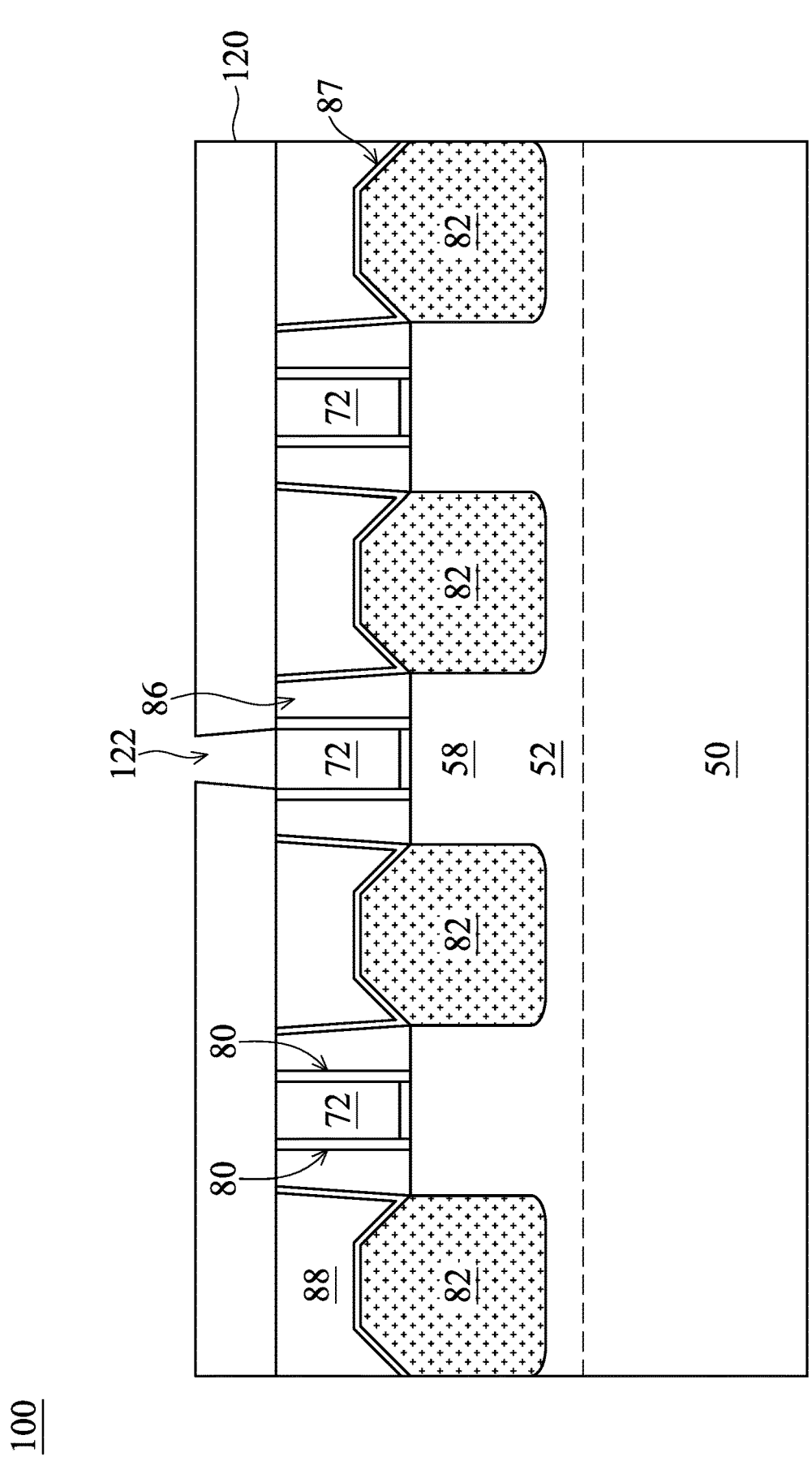

Referring first to FIGS. 13A through 13C, a hard mask 120 may be deposited and patterned over the first ILD 88, the dummy gates 72, the gate seal spacers 80, the CESL 87, and the gate spacers 86. The hard mask 120 may be patterned to provide openings 122, which expose portions of the dummy gates 72. FIG. 13C illustrates a top down view of the hard mask 120 and the openings 122. Locations of the dummy gates 72 and the fins 52 are illustrated in ghost for reference. As further illustrated in FIG. 13C, the locations of the cross-sections A-A and B-B are provided. Subsequent figures reference these cross-sections for clarity. Specifically, FIGS. 13A, 14A, 15A, 16A, and 17A illustrate views along cross-section A-A (e.g., in a direction parallel to a lengthwise direction of the fins 52) and through one of the openings 122, and FIGS. 13B, 14B, 15B, 16B, 17B, and 17C illustrate views along cross-section B-B (e.g., in a direction perpendicular to the lengthwise direction of the fins 52) and through one of the openings 122.

A material of the hard mask 120 may be selected so that it may be selectively patterned relative to a material of the underlying layers, such as the dummy gates 72 and/or the first ILD 88. For example, the hard mask 120 may comprise any suitable material, such as, silicon nitride, silicon oxynitride, silicon carbon nitride, amorphous silicon, $Al_2O_3$, or the like, which is deposited using a suitable process, such as, PVD, CVD, ALD, combinations thereof, or the like.

The hard mask 120 may be patterned using a combination of photolithography and etching, for example, to include the openings 122 that expose portions of the dummy gates 72. A pattern of the openings 122 may correspond to gate cut locations of the dummy gates 72 (e.g., areas where adjacent portions of the dummy gates 72 are to be physically separated). As a result of the etching process used to pattern the hard mask 120, a width of the openings 122 at a top surface of the hard mask 120 may be less than a width of the openings 122 at a bottom surface of the hard mask 120. For example, the etching process may leave a slight overhang at the top surface of the hard mask 120, which results in a slightly narrower critical dimension (e.g., width) at tops of the openings 122 than bottoms of the openings 122.

Figure 14A:
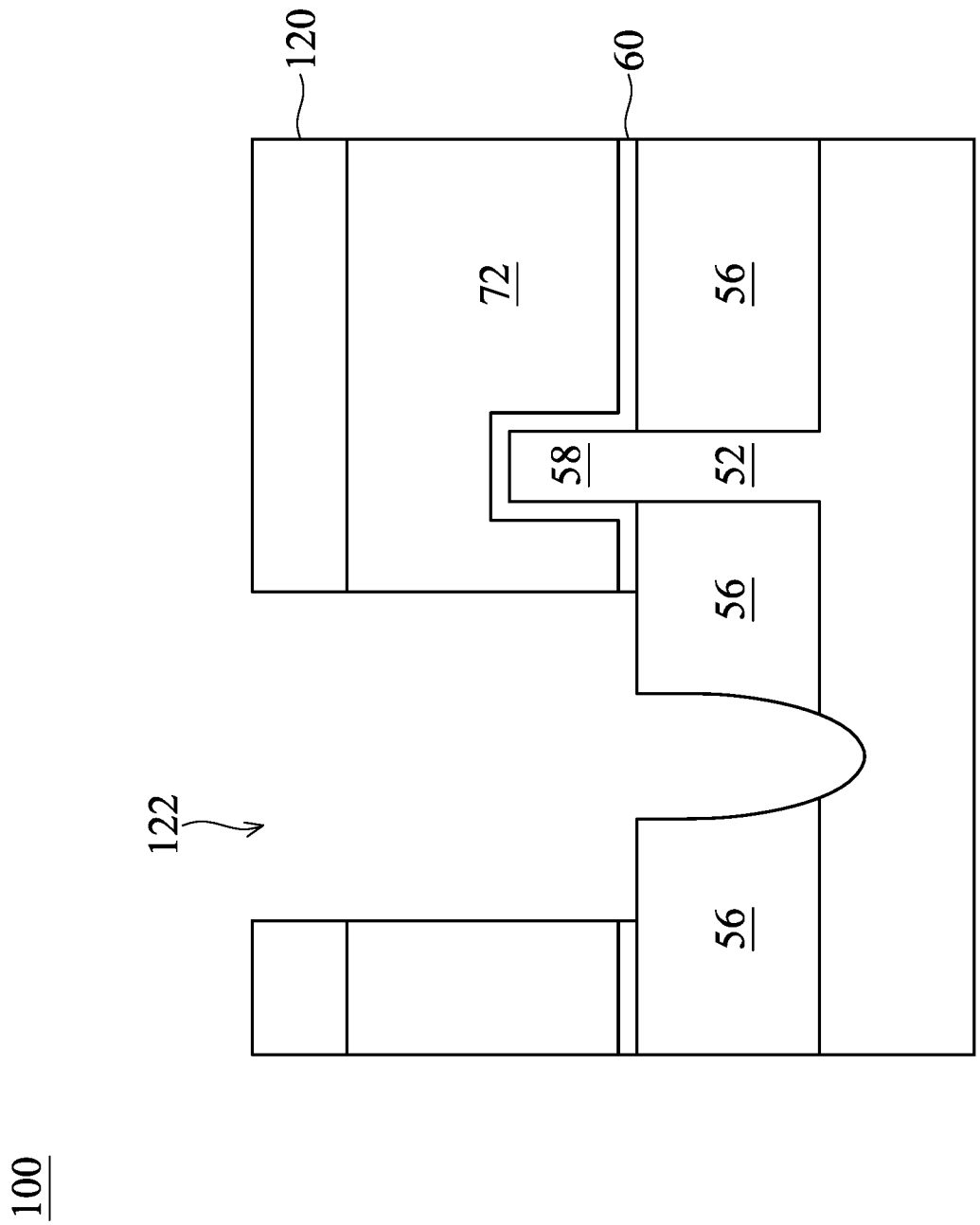
Figure 14B:
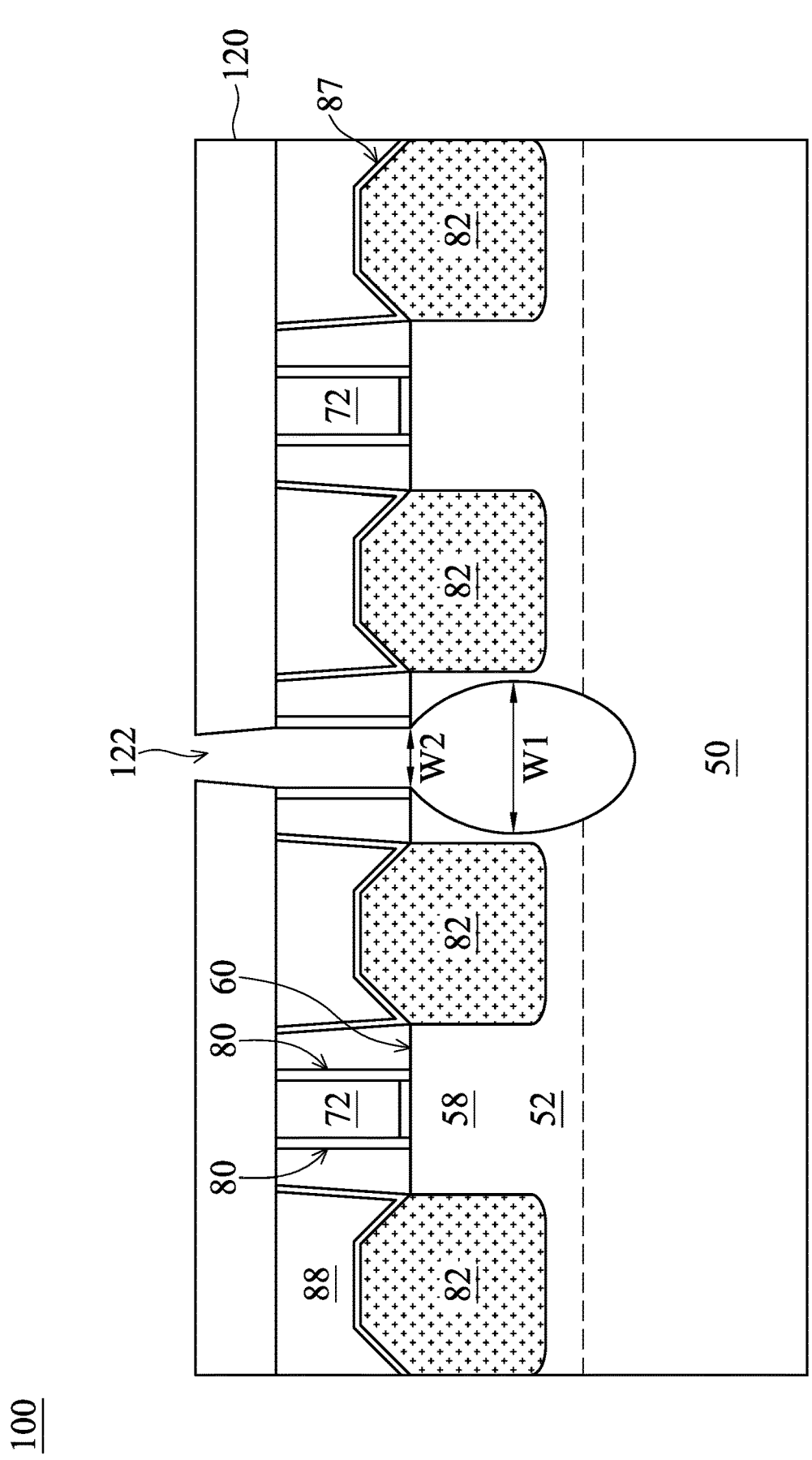

In FIGS. 14A and 14B, the openings 122 are extended through the dummy gates 72 and the fins 52 into the substrate 50. Extending the openings 122 may include one or more etching processes, such as dry etch(es), wet etch(es), the like, or any combination thereof. For example, extending the openings 122 may include a first etching process that removes portions of the dummy gates 72 and portions of the dummy dielectric layer 60 exposed by the hard mask 120. Subsequently, a second etching process may be applied to remove portions of the fins 52 exposed by the mask 120, thereby extending the openings 122 through the fins 52 and into the substrate 50. The second etching process may be a same or separate etching process as the first etching process used to remove the portions of the dummy gates 72 and the dummy dielectric layer 60. The second etching process may be a selective etching process that can selectively etch the fins 52 and the substrate 50 at a higher rate than the STI regions 56. As a result, the openings 122 may extend to different depths (e.g., less) in the STI regions 56 than the substrate 50. Further, the second etching process may have laterally etch the fins 52 a different amount at different depths. For example, a width W2 of the openings 122 at a top surface of the fins 52 may be less than a maximum width W1 of the openings 122 in the cross-section illustrated by FIG. 14B. In some embodiments, the maximum width W1 may be in a range of 28 nm to 38 nm, and the width W2 may be in a range of 13 nm to 30 nm. Other dimensions may also be possible in other embodiments.

Figure 15A:
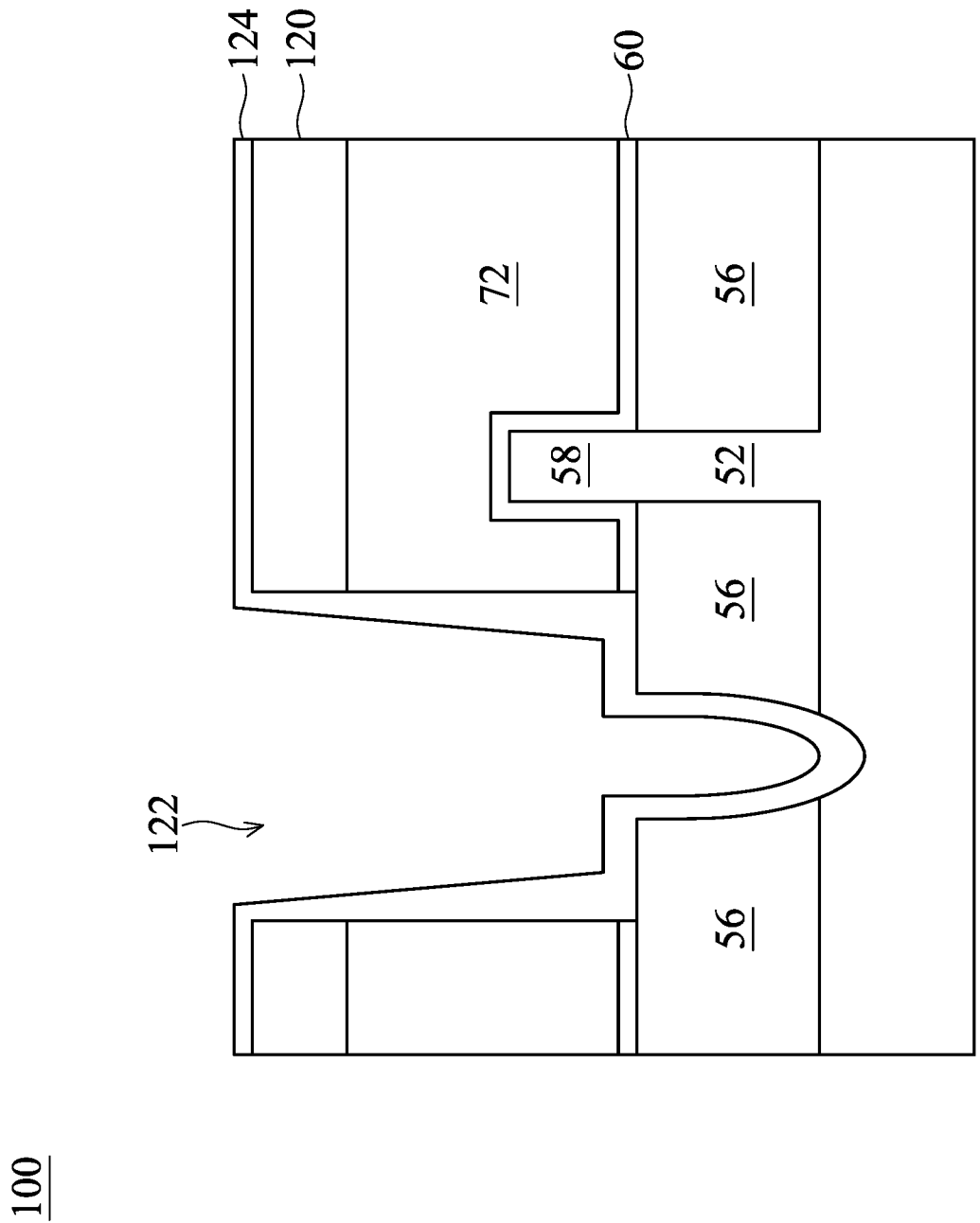
Figure 15B:
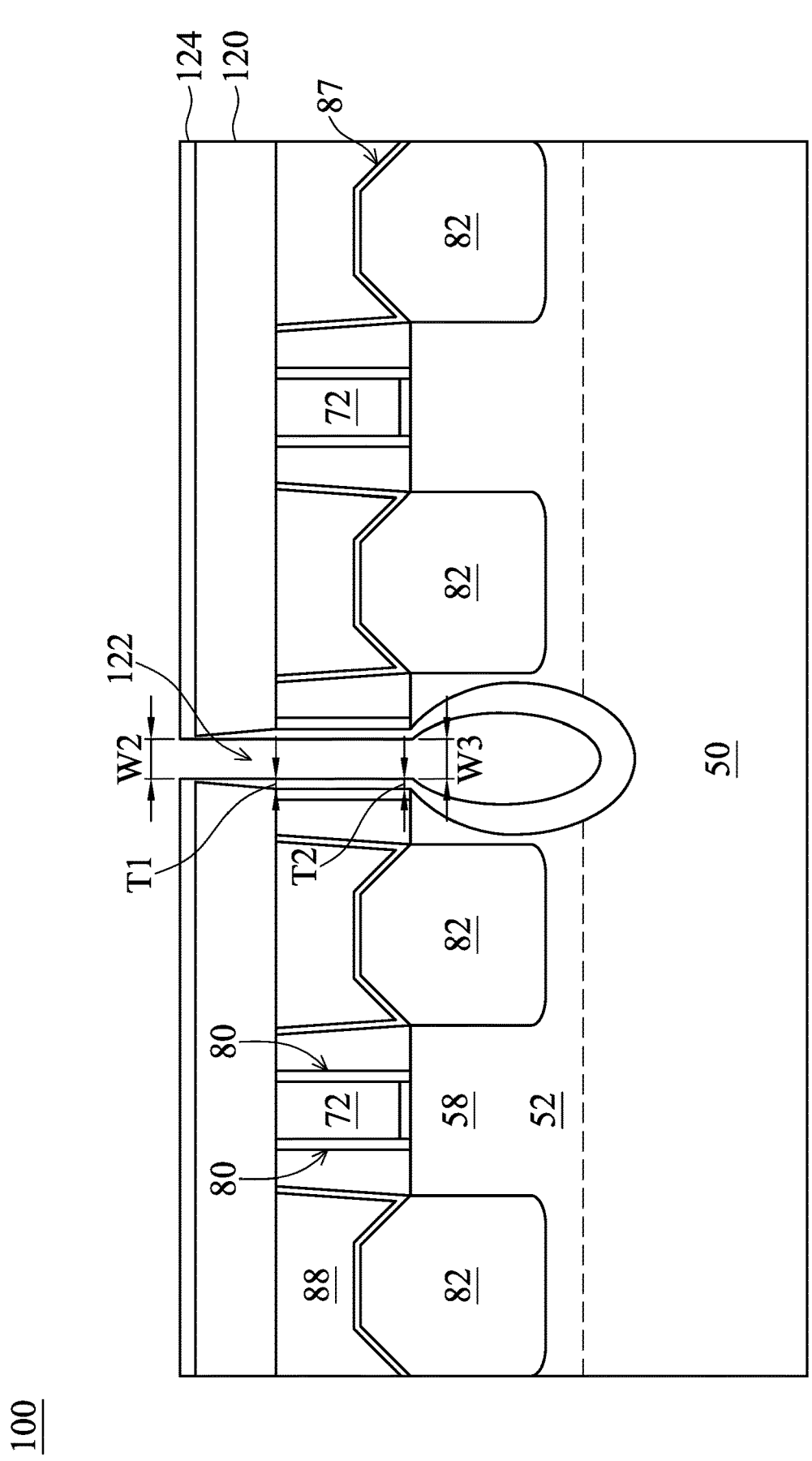

In FIGS. 15A and 15B, a dielectric liner 124 is deposited over the mask 120, on sidewalls of the openings 122, and along a bottom surface of the openings 122. The dielectric liner 124 may also be referred as a spacer 124 or spacer layer 124 subsequently. The dielectric liner 124 may comprise silicon nitride, silicon oxynitride, silicon carbon nitride, silicon carbon oxynitride, or the like, which is deposited using a non-conformal deposition process. As a result of the non-conformal deposition process, the dielectric liner 124 may have a varied thickness as it extends along sidewalls of the dummy gates 72. In some embodiments, a thickness T1 of the dielectric liner 124 at a top surface of the first ILD 88 may be different than a thickness T2 of the dielectric liner 124 at a bottom surface of the first ILD 88/top surfaces of the fins 52. Specifically, the thickness T1 may be less than the thickness T2, and a width W2 at a top of the openings 122 may be greater than a width W3 at the bottom surface of the first ILD 88/the top surfaces of the fins 52. As a result, a deposition window for a dielectric fill material that is subsequently deposited into the openings 122 is advantageously widened do to the increased width of at the top of the openings 122 after the dielectric liner 124 is deposited.

In some embodiments, the non-conformal deposition process is a plasma-enhanced atomic layer deposition (PEALD) process that applies a plasma treatment to achieve the varying widths of the dielectric liner 124 described above. The PEALD process may include flowing precursor process gases including nitrogen ($N_2$) plasma into the deposition chamber. The precursor process gases may further include thermal $SiH_2I_2$ (e.g., heated to be in a gaseous state), hydrogen ($H_2$) plasma, the like, and/or combinations thereof when the dielectric liner 124 comprises silicon nitride. By flowing a nitrogen plasma precursor as part of the PEALD process, a nitrogen plasma treatment is applied to the surfaces exposed by the openings 122. As a result of the nitrogen plasma treatment, an incubation time for depositing the dielectric liner 124 may be worsened at the tops of the openings 122 compared to bottoms of the openings 122, and the dielectric liner 124 is deposited thinner at the tops of the openings 122 compared to the bottoms of the openings 122. In some embodiments, the PEALD plasma may be performed at a temperature in a range of 300° C. and 600° C., at a pressure in a range of 7.5 Torr to 90 Torr, and for a duration of 10 minutes to 60 minutes, for example. Other embodiments may perform the PEALD process with different processing parameters.

Figure 16A:
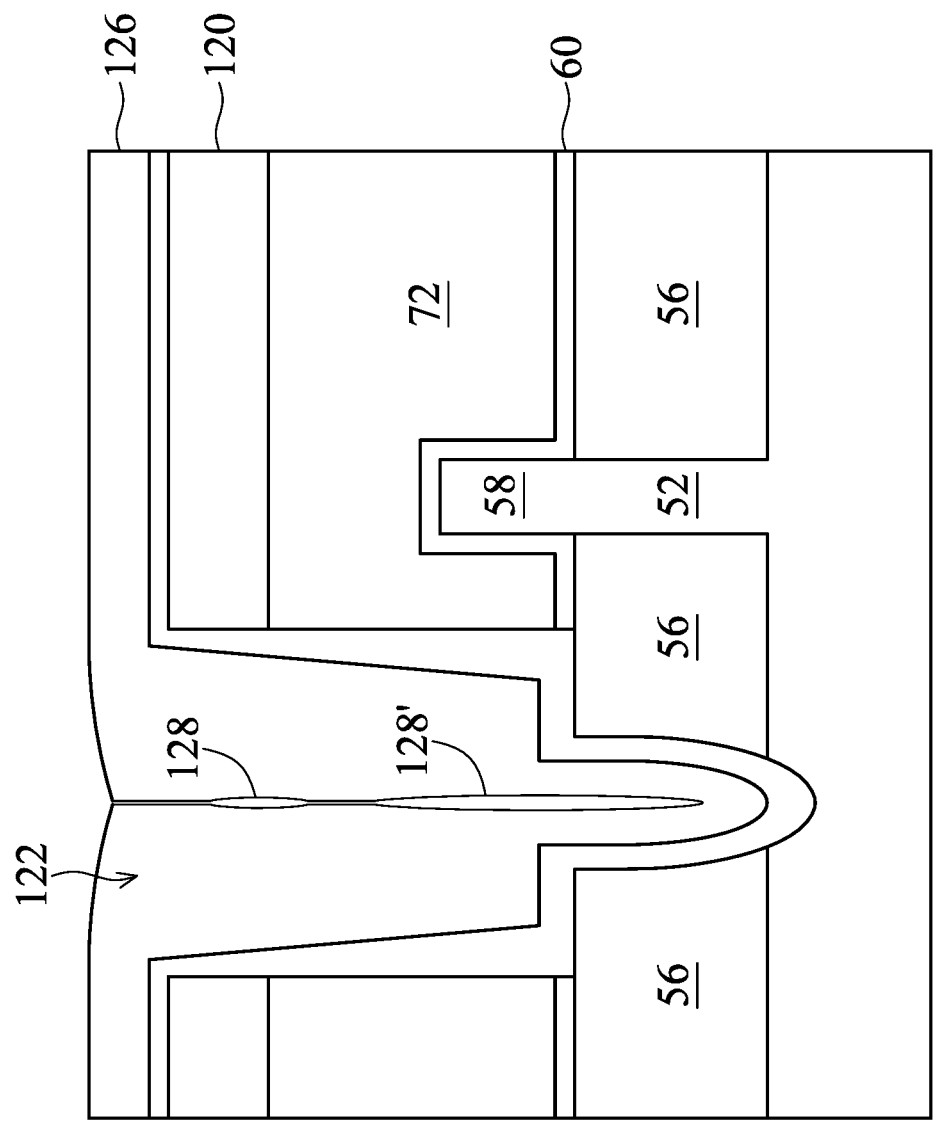
Figure 16B:
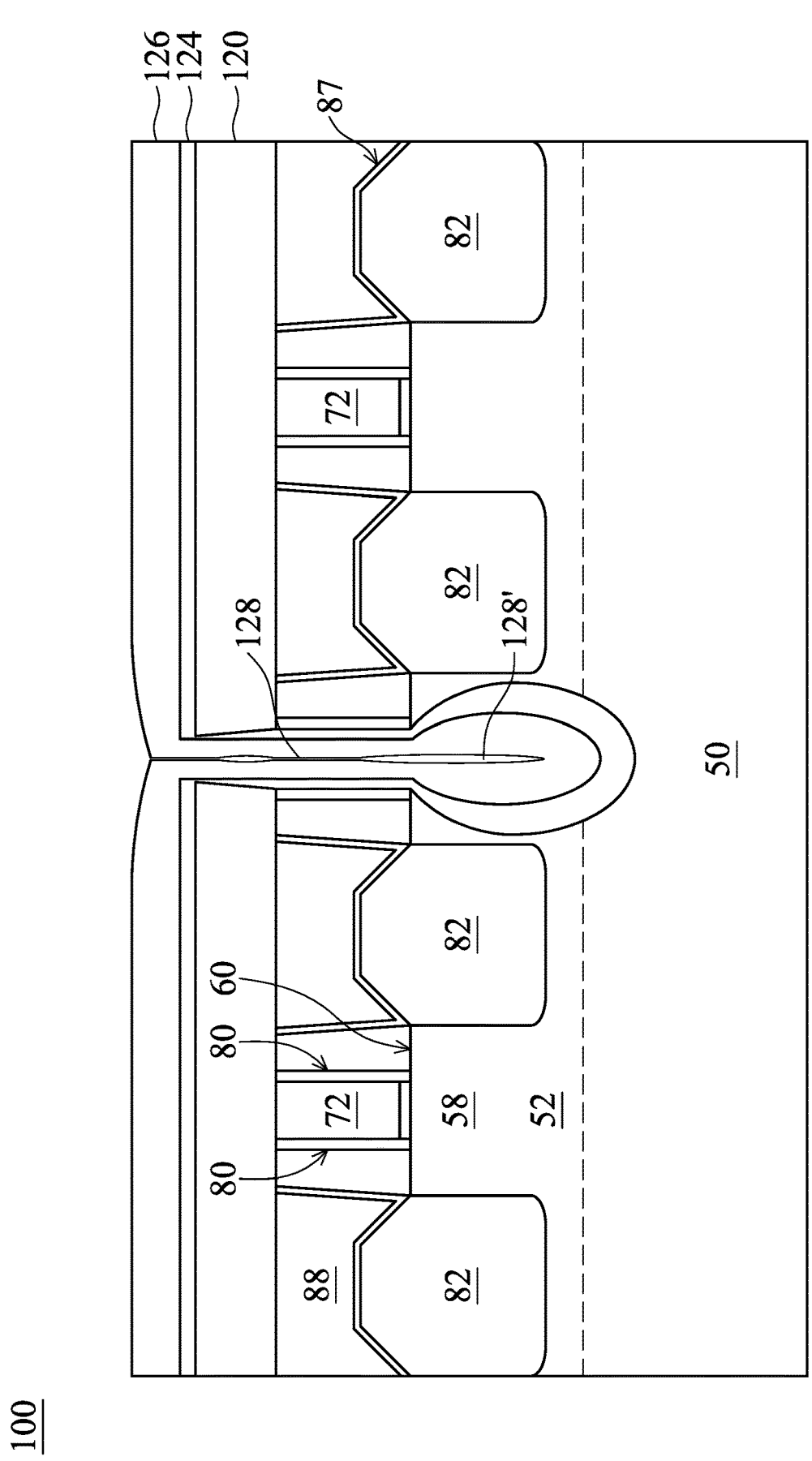

In FIGS. 16A and 16B, a dielectric fill material 126 is deposited in the openings 122 over the dielectric liner 124. In some embodiments, the dielectric fill material 126 may comprise a similar material (e.g., silicon nitride) as the dielectric liner 124. However, the dielectric fill material 126 may be deposited using a different type of process than the dielectric liner 124. For example, the dielectric fill material 126 may be deposited with a conformal process, such as an ALD process, instead of the non-conformal, PEALD process used to deposit the dielectric liner 124. In some embodiments, the ALD process for depositing the dielectric fill material 126 may be a thermal process without the use of plasma. As part of the ALD process, the dielectric fill material 126 may be deposited on surfaces of the openings 122 until portions of the dielectric fill material 126 merge together, defining a seam 128 and filling the openings 122. Due to the profile of the dielectric liner 124 (e.g., thinner at the tops of the openings 122), a deposition window of the dielectric fill material 126 may be widened and relatively small seams 128 may be formed within the dielectric fill material. Further, the seams 128 may be include a void 128' in a lower portion of the dielectric fill material 126, and the void 128' may advantageously reduce a dielectric constant of the resulting gate isolation structure, thereby reducing parasitic capacitance.

Figure 17A:
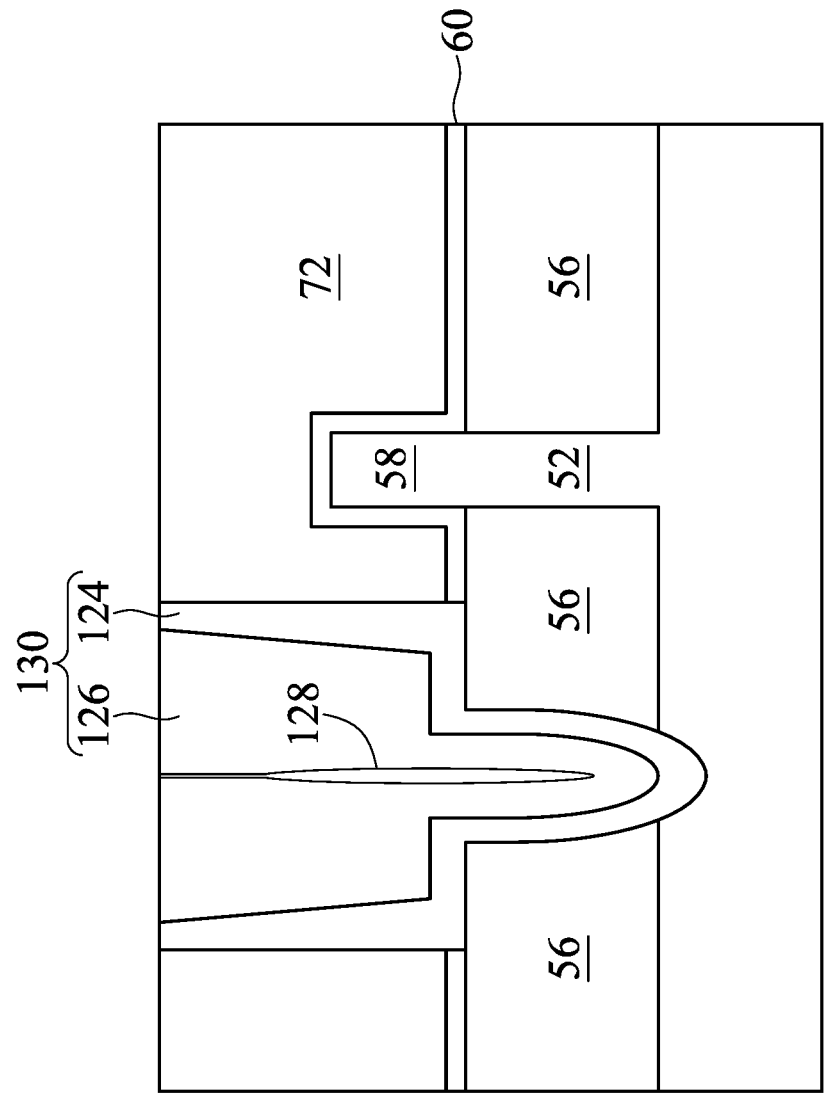
Figure 17B:
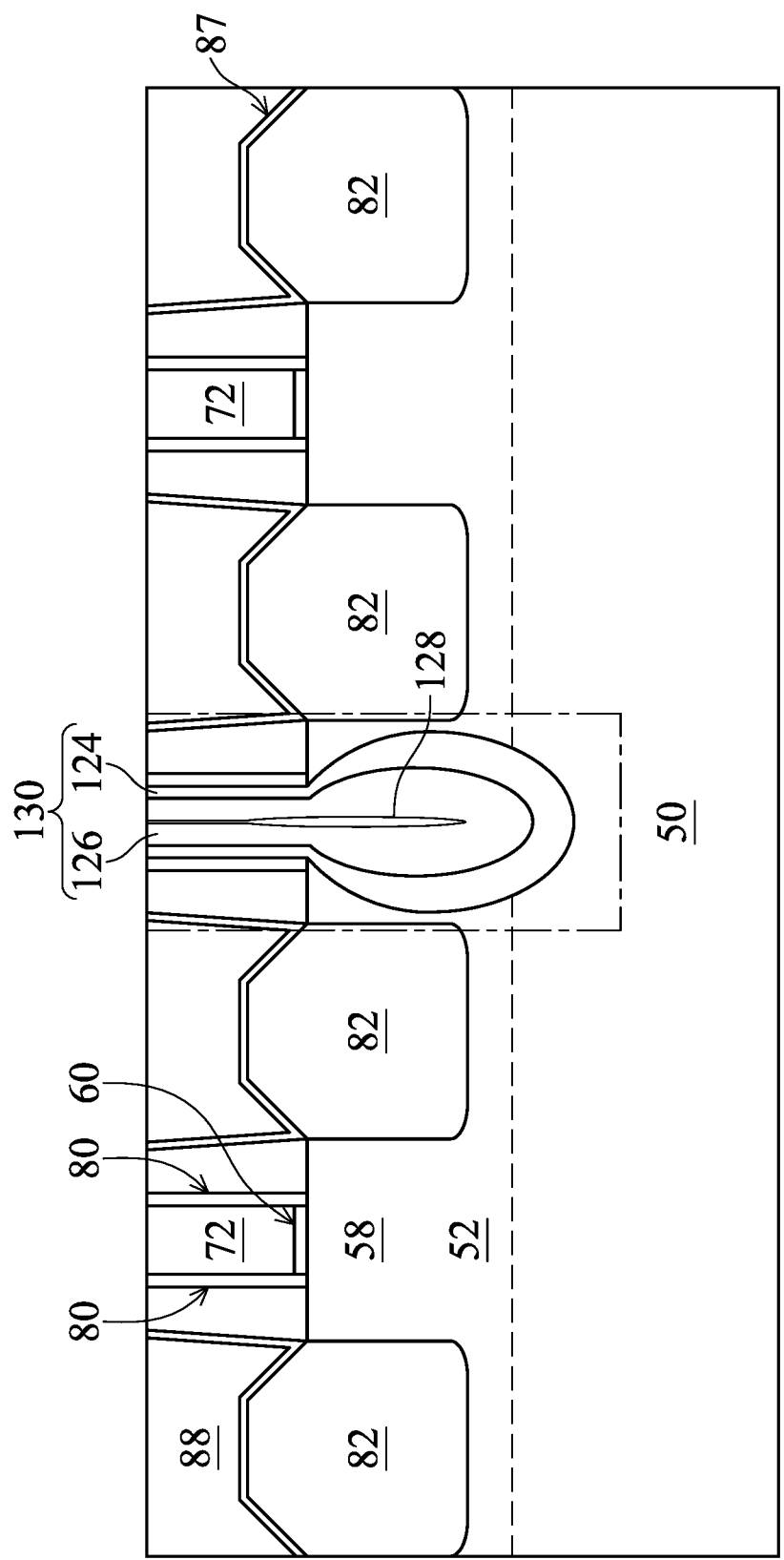

In FIGS. 17A through 17C, a planarization process is applied to remove excess portions of the dielectric liner 124 and the dielectric fill material 126 (e.g., portions outside of the openings 122). The planarization process may further remove the hard mask 120. The planarization process may be a CMP process, an etch back process, the like, or combinations thereof. Thus, gate isolation structures 130 comprising remaining portions of the dielectric liner 124 and the dielectric fill material 126 are formed. The gate isolation structures 130 may be used to physically separate portions of the dummy gates 72 and to help define a pattern of subsequently formed replacement gate structures.

As a result of embodiment deposition processes described above, the gate isolation structures 130 may have certain advantageous dimensions. FIG. 17C illustrates a detailed view of the gate isolation structures 130 in a similar cross-section as FIG. 17B (e.g., along the cross-section B-B described above). The dielectric liner 124 may have a lateral dimension D1 at top surface of the fin 52 (e.g., a level of a bottom surface of the first ILD 88) and a lateral dimension D2 at a level of a top surface of the first ILD 88. The lateral dimension D2 may be less than the lateral dimension D1 due to the deposition process (e.g., PEALD with nitrogen plasma) used to form the dielectric liner 124. In some embodiments, the lateral dimension D1 may be in a range of 3.8 nm to 22.5 nm while the lateral dimension D2 may be in a range of 3 nm to 18 nm. A ratio of the lateral dimension D1 to the lateral dimension lateral D2 may be in a range of 1.1 to 1.5, for example. It has been observed that by forming the dielectric liner 124 to have the above dimensions/profile, advantageous can be achieved such as widening a deposition window for the dielectric fill material 126, thereby reducing a size of the seam 128 and reducing manufacturing defects. For example, the seam 128 may have a lateral dimension D4 in an upper portion of the gate isolation structure 130 in a range of 1.5 nm to 9 nm. It has been observed by having a seam of the above dimensions, manufacturing defects can be advantageously reduced. Specifically, a seam of the above dimensions may be sufficiently small to avoid risk of over etching the gate isolation structure 130 or of metal particles being trapped within the seam during subsequently contact formation processes and causing electrical shorts. Further, the seam 128 may include a void 128' in a lower portion of the gate isolation structure 130, and the void 128' may have a lateral dimension D3 in a range of 0.5 nm to 3 nm at its widest point in a cross-sectional view. The lateral dimension D3 of the void 128' may be wider than the lateral dimension D4 of the upper portion of the seam 128. It has been observed that by including a void of the above dimensions, a dielectric constant of the gate isolation structure 130 can be reduced, thereby reducing parasitic capacitance. Still further, the dielectric fill material 126 a lateral dimension D5 at a same level as the top surface of the first ILD 88, a lateral dimension D6 at a top surface of the fin 52 (e.g., a same level as the bottom surface of the first ILD 88); and a lateral dimension D7 at a widest point of the dielectric fill material 126 in a cross-sectional view (e.g., in the fin 52). The lateral dimension D5 may be larger than the lateral dimension D6, and the lateral dimension D7 may be larger than each of the lateral dimensions D5 and D6. In some embodiments, the lateral dimension D5 may be in a range of 3.3 nm to 19.5 nm; the lateral dimension D6 may be in a range of 2.5 nm to 15 nm; and the lateral dimension D7 may be in a range of 5 nm to 15 nm. A ratio of the lateral dimension D6 to the lateral dimension D5 may be in a range of 0.7 to 0.9, and a ratio of the lateral dimension D6 to the lateral dimension D7 may be in a range of 0.4 to 0.6, for example.

FIGS. 18A through 22B illustrate subsequent steps of replacing the dummy gates 72 with functional gate stacks and forming various contacts. FIGS. 18A, 19A, 20A, 21A, and 22A illustrate views along cross-section A-A (e.g., in a direction parallel to a lengthwise direction of the fins 52) and through one of the gate isolation structures 130, and FIGS. 18B, 19B, 20B, 21B, and 22B illustrate views along cross-section B-B (e.g., in a direction perpendicular to the lengthwise direction of the fins 52) and through one of gate isolation structures 130. FIGS. 19C through 19F illustrate varying views of the device after the functional gate stacks are formed.

Figure 18A:
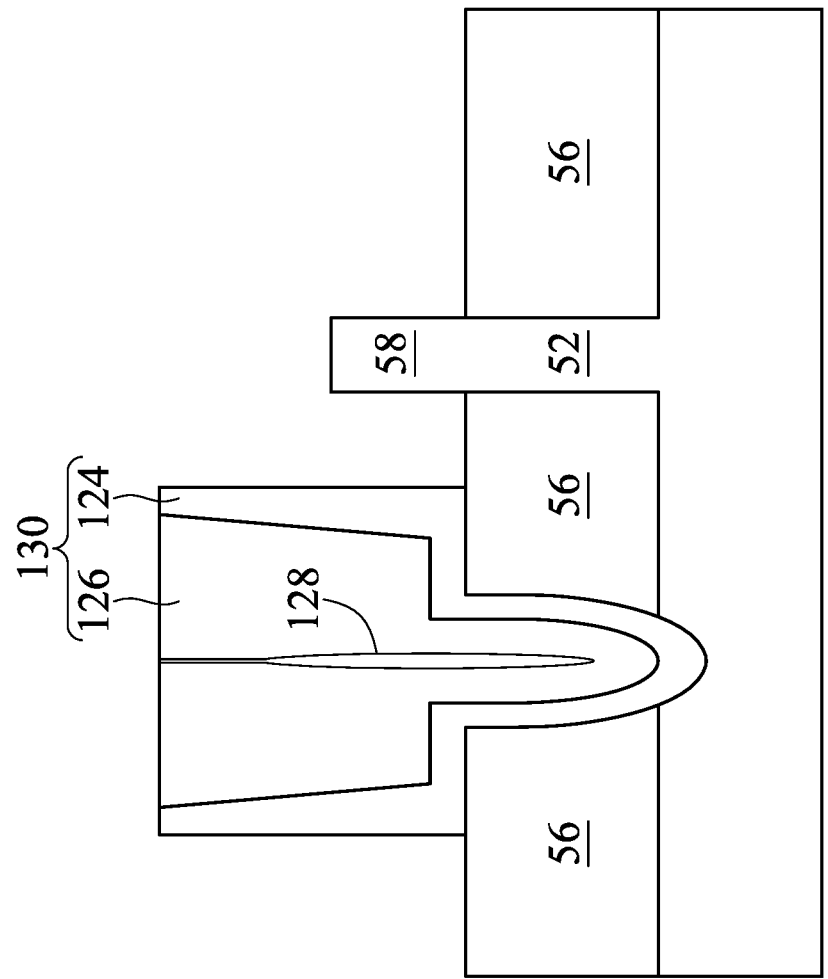
Figure 18B:
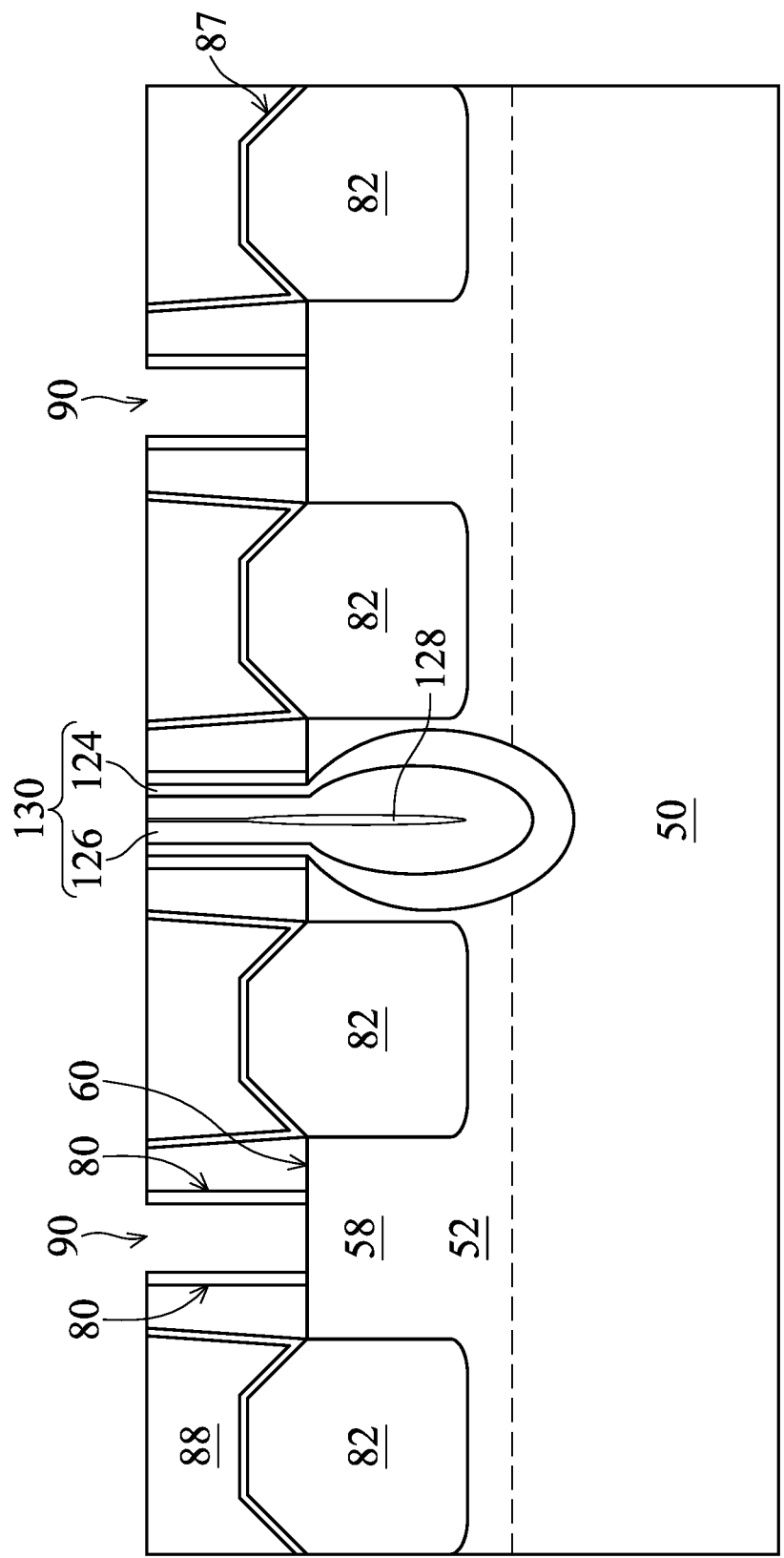

In FIGS. 18A and 18B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88, the gate isolation structures 130, or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 19A:
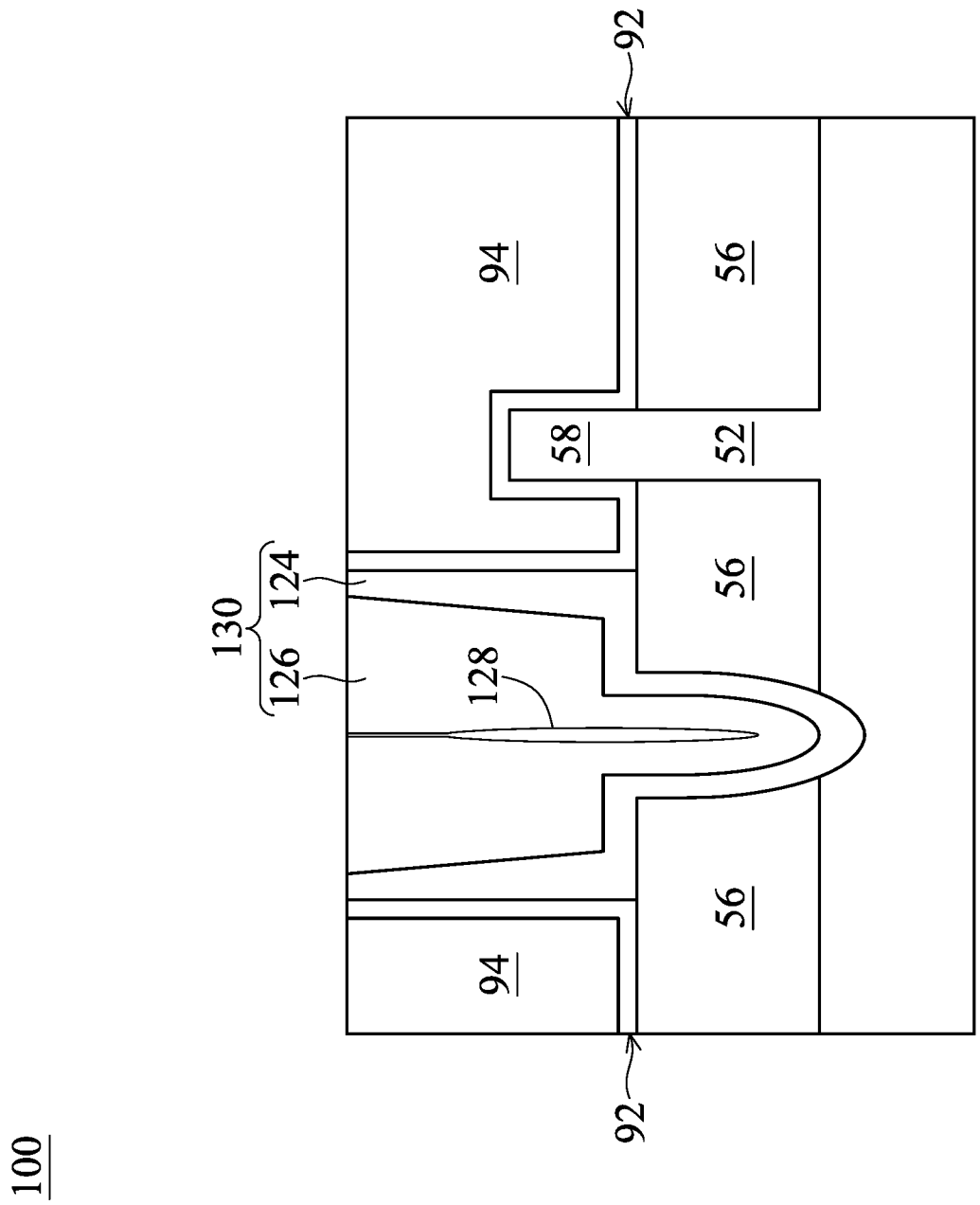
Figure 19B:
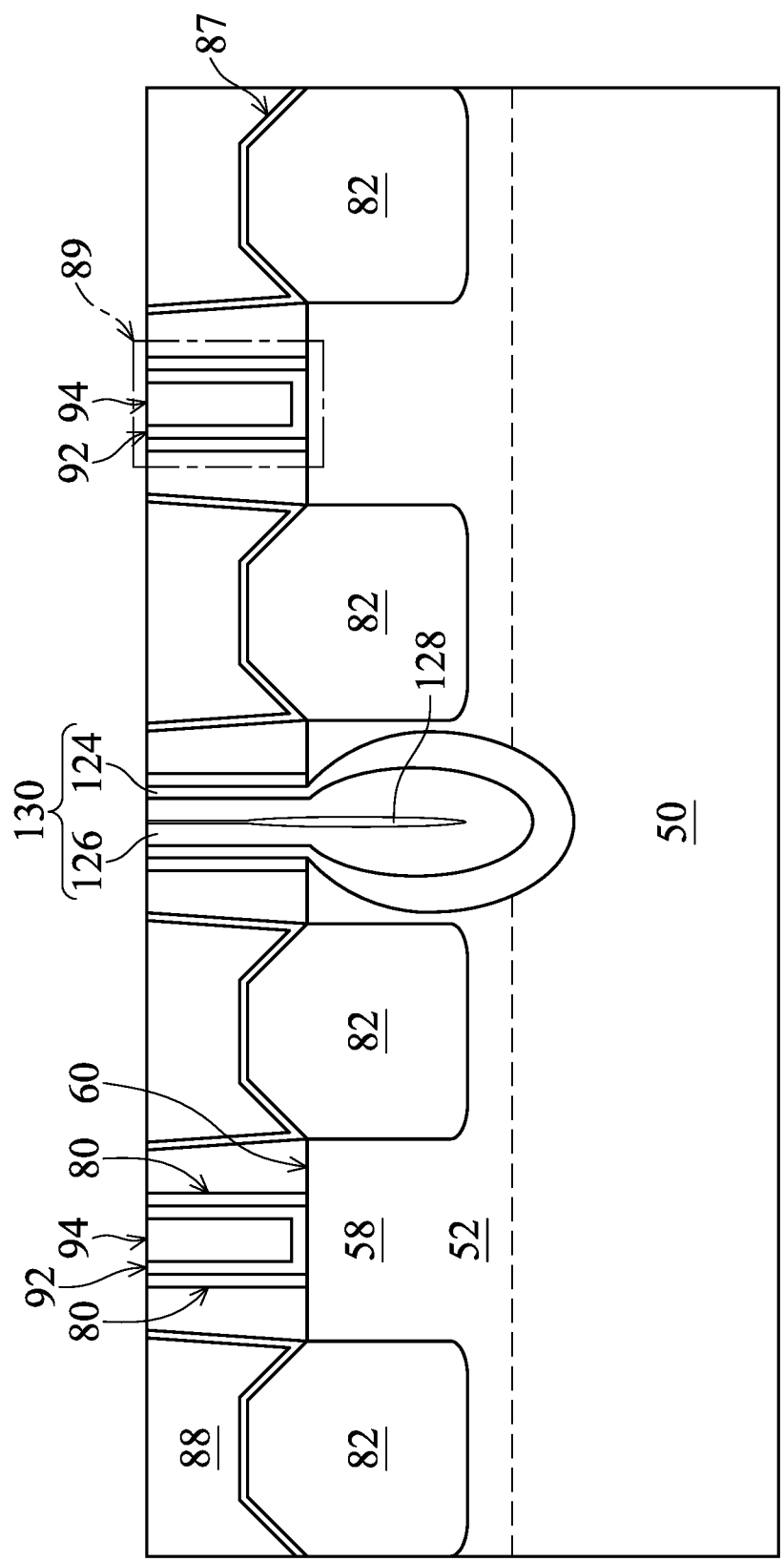
Figure 19C:
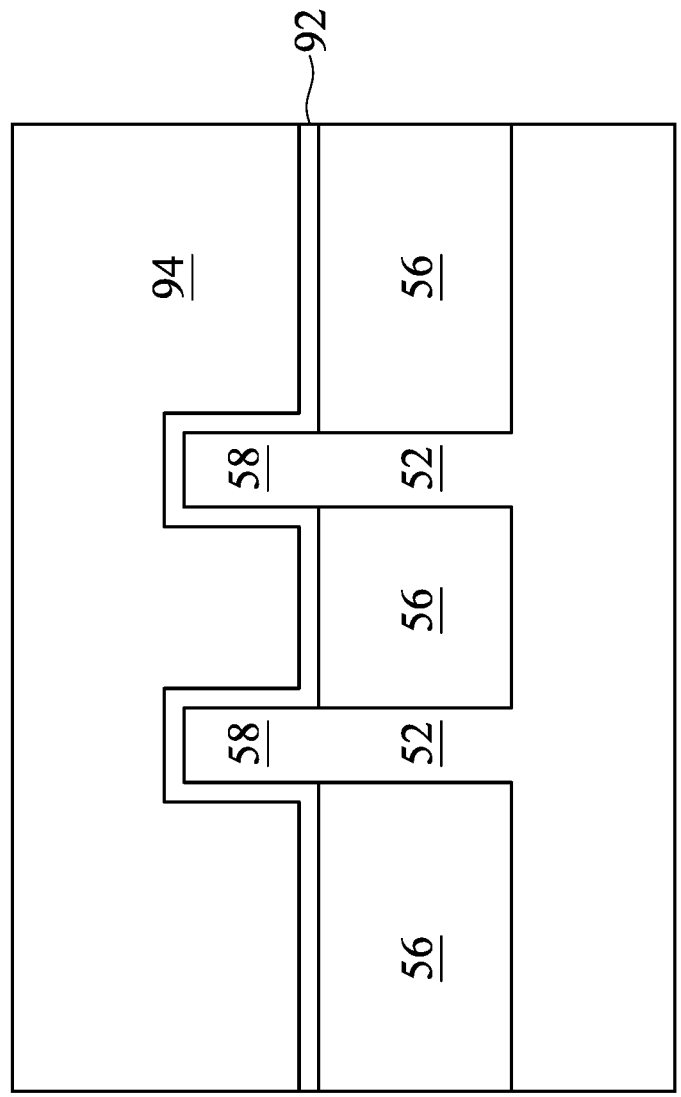
Figure 19D:
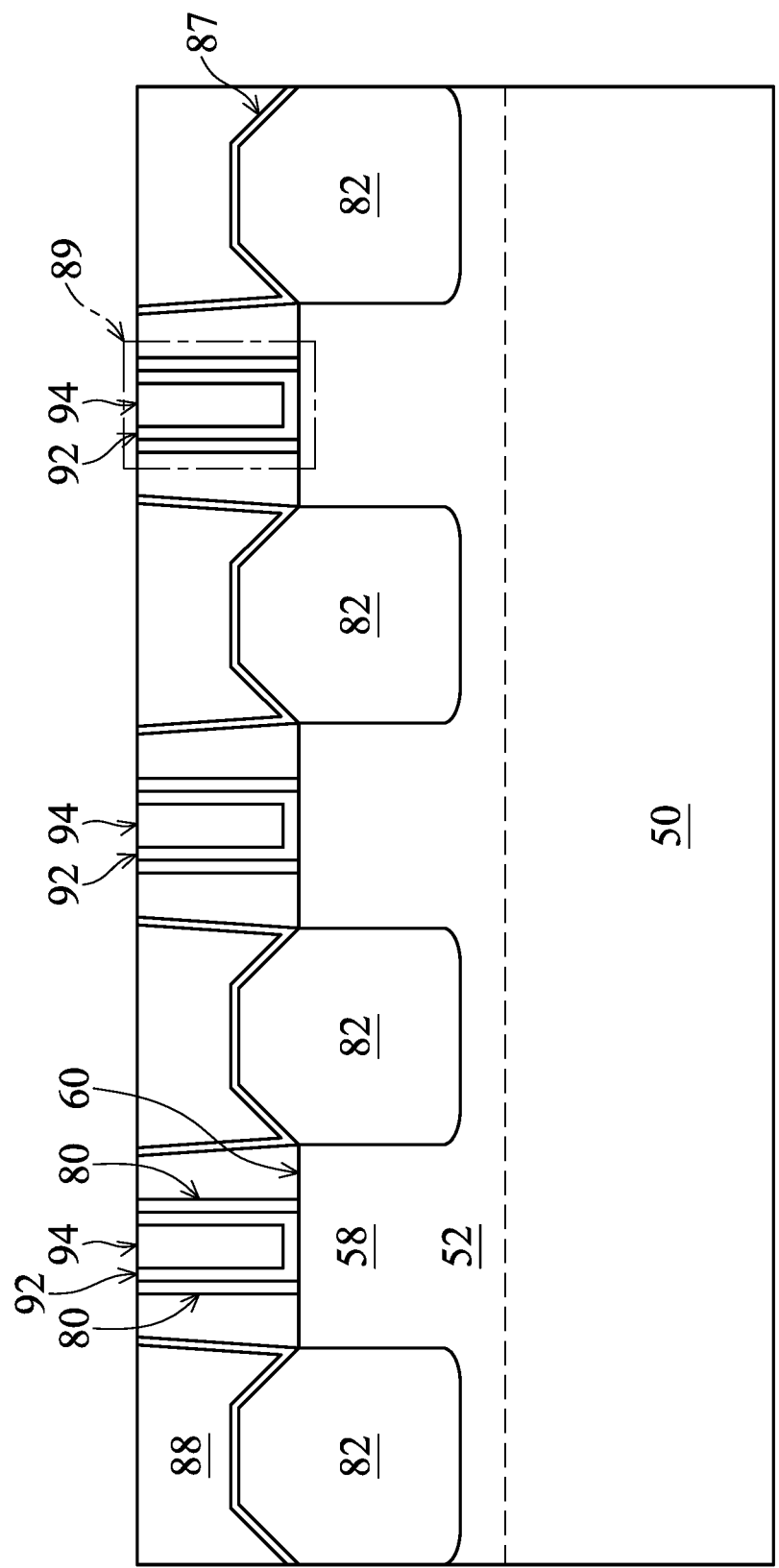
Figure 19E:
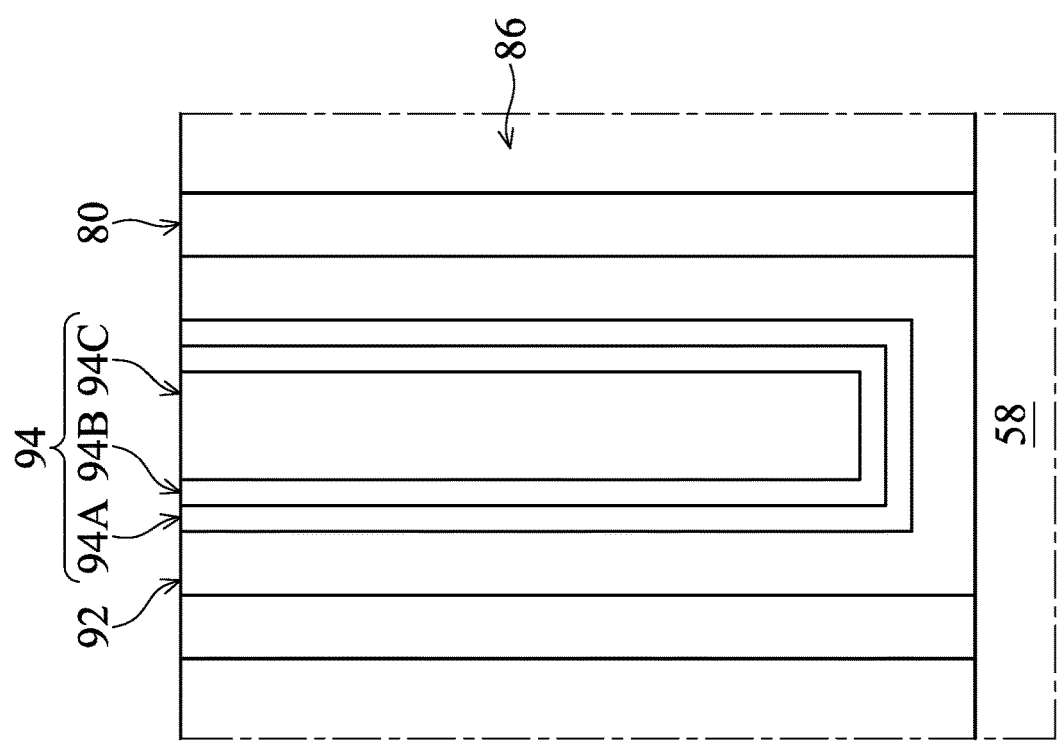
Figure 19F:
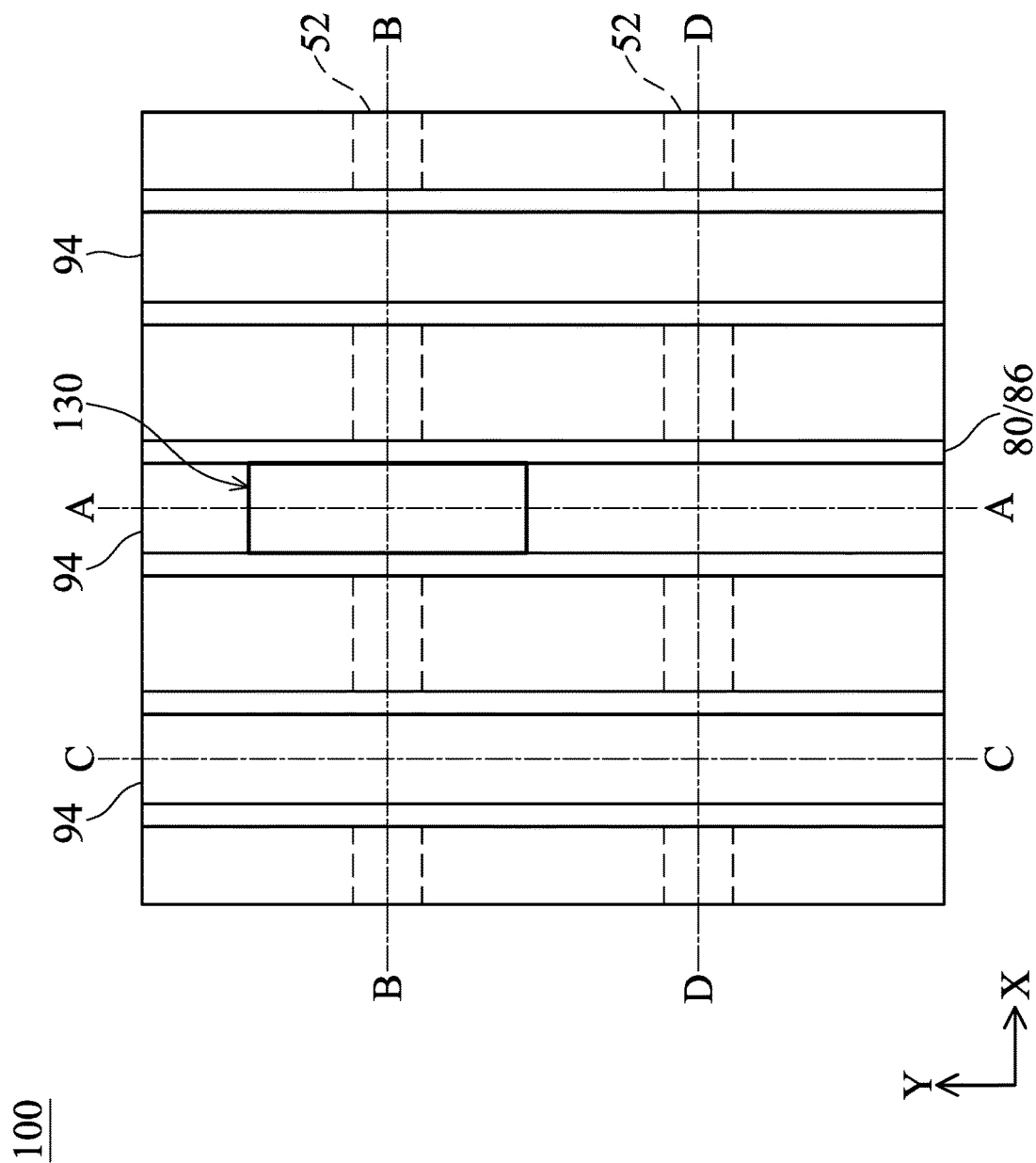

In FIGS. 19A through 19F, gate dielectric layers 92 and gate electrodes 94 are formed for replacement gates. FIG. 19F illustrates a top down view and locations of various cross-sections. FIG. 19A illustrates a cross-sectional view along line A-A of FIG. 19F (e.g., through the gate isolation structure 130); FIG. 19B illustrates a cross-sectional view along line B-B of FIG. 19F (e.g., through the gate isolation structure 130); FIG. 19C illustrates cross-sectional view along line C-C of FIG. 19F (e.g., not extending through the gate isolation structure 130 and parallel to the cross-section A-A); and FIG. 19D illustrates a cross-sectional view along the line D-D of the FIG. 19F (e.g., not extending through the gate isolation structure 130 and parallel to the cross-section B-B). FIG. 19E illustrates a detailed view of region 89 of FIGS. 19B and 19D.

Gate dielectric layers 92 include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIGS. 19B and 19D, the gate electrode 94 may comprise any number of liner layers 94A, any number of work function tuning layers 94B, and a fill material 94C as illustrated by FIG. 19E. In some embodiments, an order of the liner layers 94A and the work function tuning layers 94B may be reversed. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52. Further, each of the gate isolation structures 130 separates adjacent, first and second gate stacks (each including a gate dielectric layer 92 and a corresponding gate electrode 94) as illustrated by FIGS. 19A and 19F.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 20A:
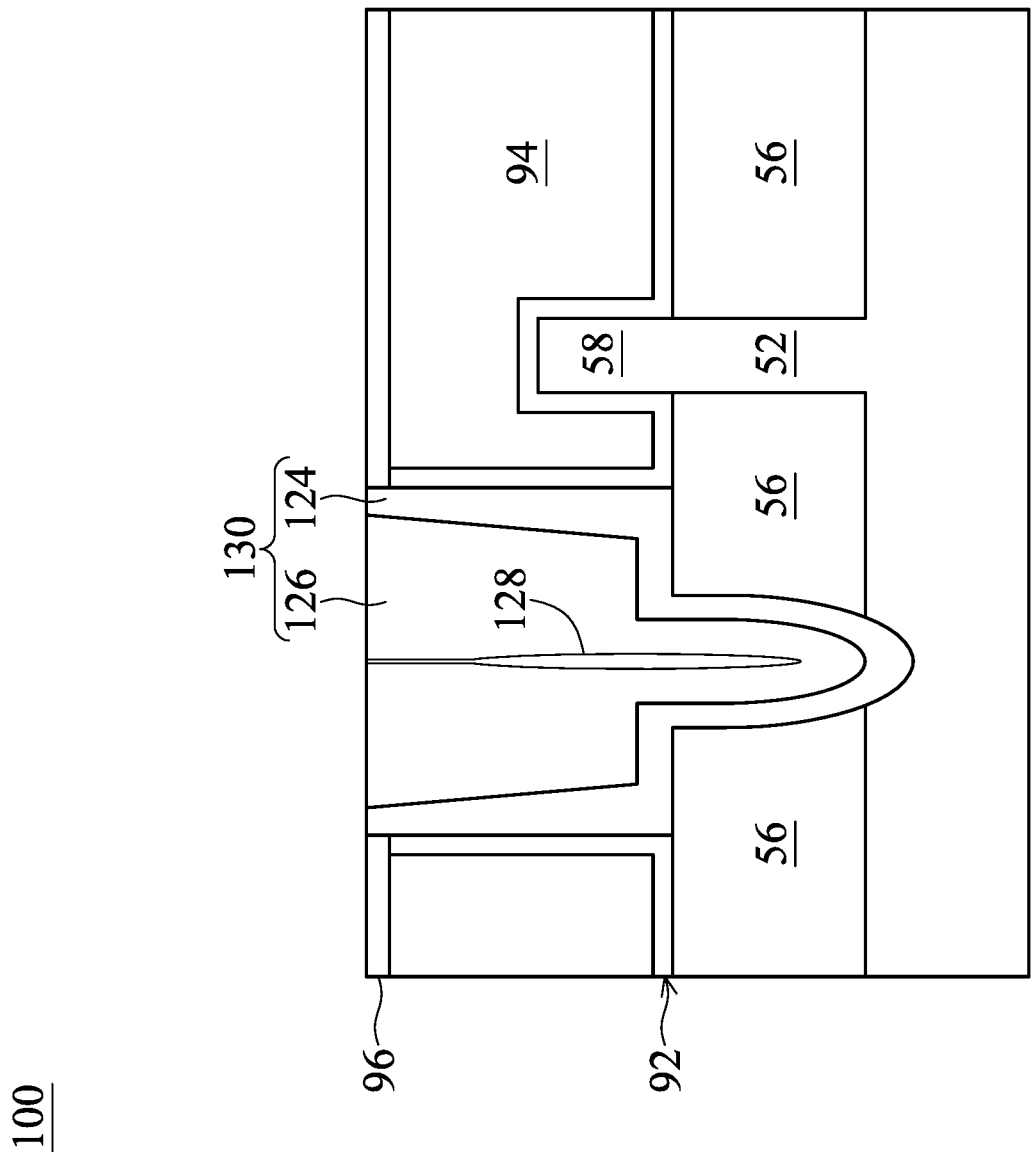
Figure 20B:
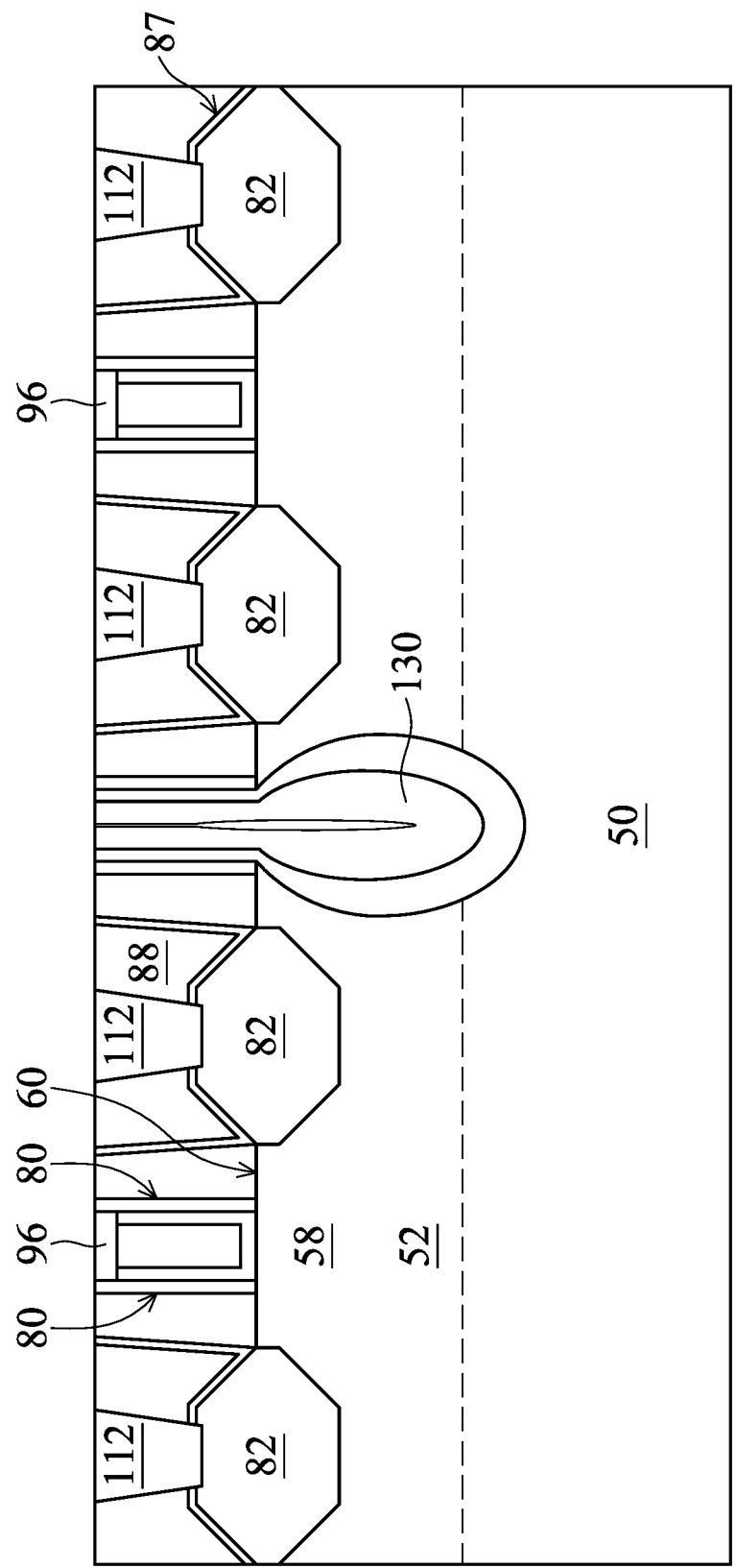

In FIGS. 20A and 20B, a gate mask 96 is formed over the gate stacks (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. The recess may further expose sidewalls of the gate isolation structures 130. The gate mask 96 may further extend along sidewalls of the gate isolation structures 130. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 20A and 20B, first level source/drain contacts 112 are formed through the first ILD 88 in accordance with some embodiments. Openings for the source/drain contacts 112 are formed through the first ILD 88. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD 88. The remaining liner and conductive material form the source/drain contacts 112 in the openings. An anneal process may be performed to form a silicide at the interface between the epitaxial source/drain regions 82 and the source/drain contacts 112. The source/drain contacts 112 are physically and electrically coupled to the epitaxial source/drain regions 82. Due to the relatively small size of the seams 128, the source/drain contacts 112 may be formed without damaging the gate isolation structures 130 (e.g., over etching or undesired trapping of metal particles).

Figure 21A:
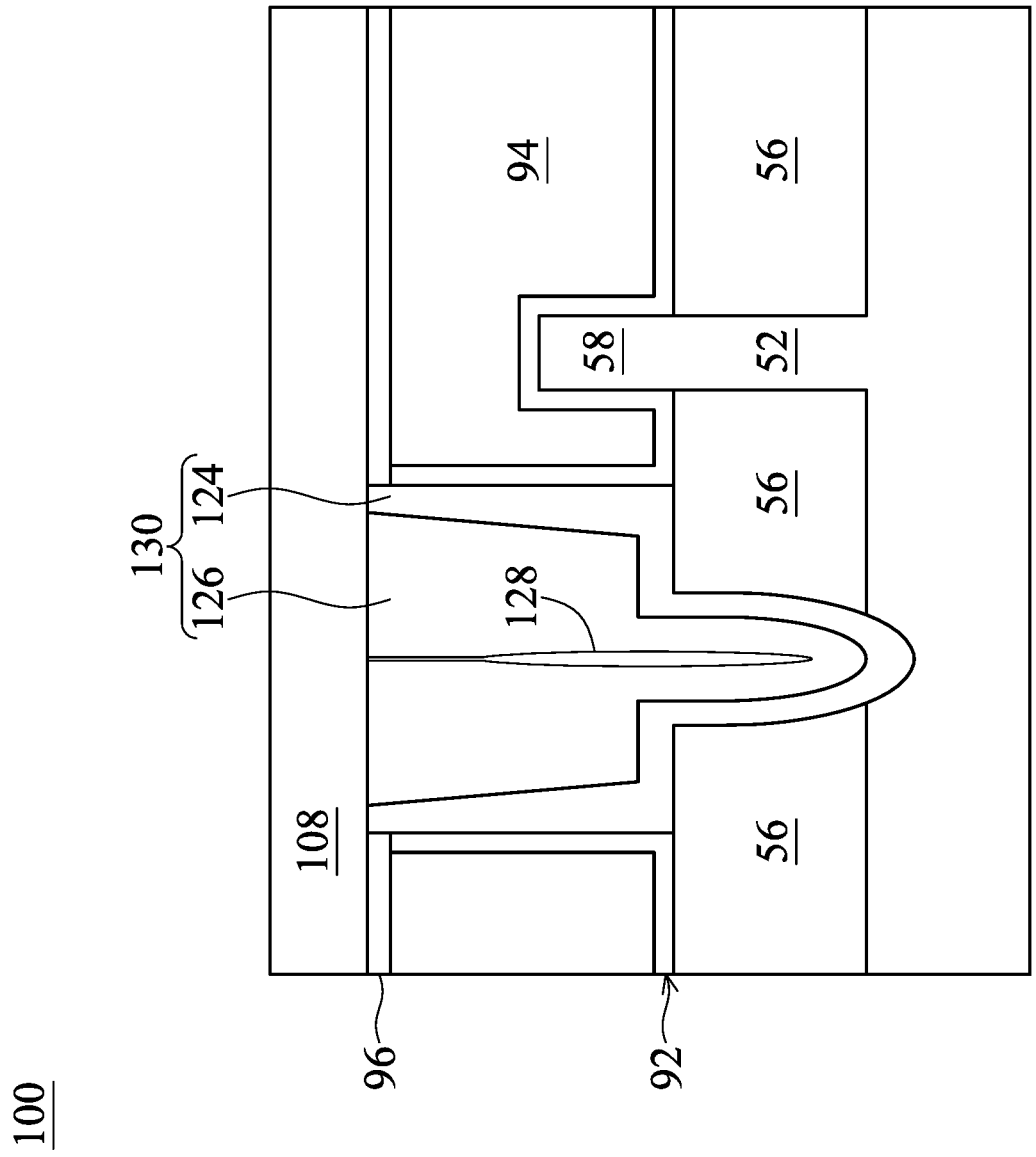
Figure 21B:
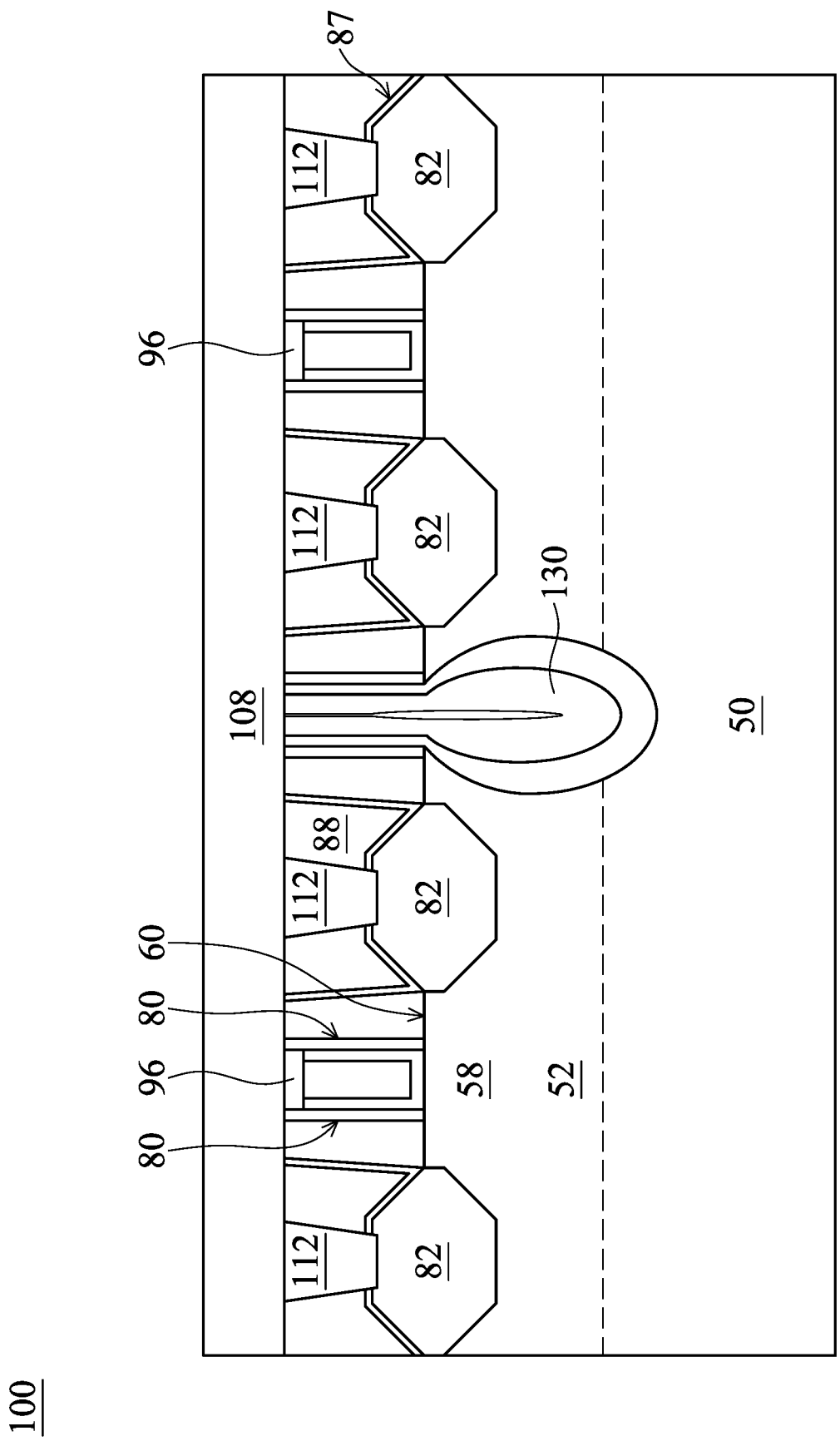

In FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 (if present) to contact the top surface of the recessed gate electrode 94.

Figure 22A:
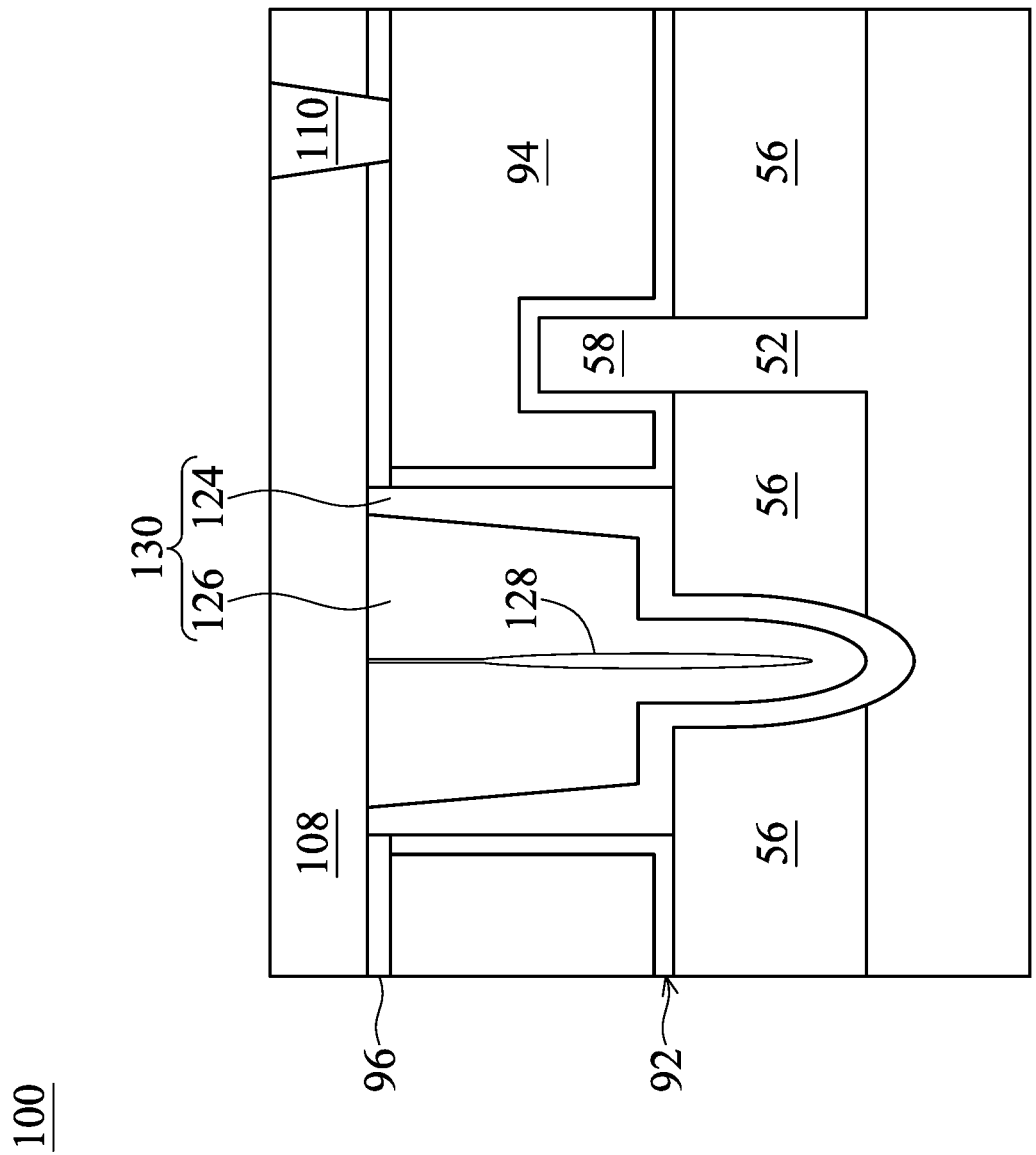
Figure 22B:
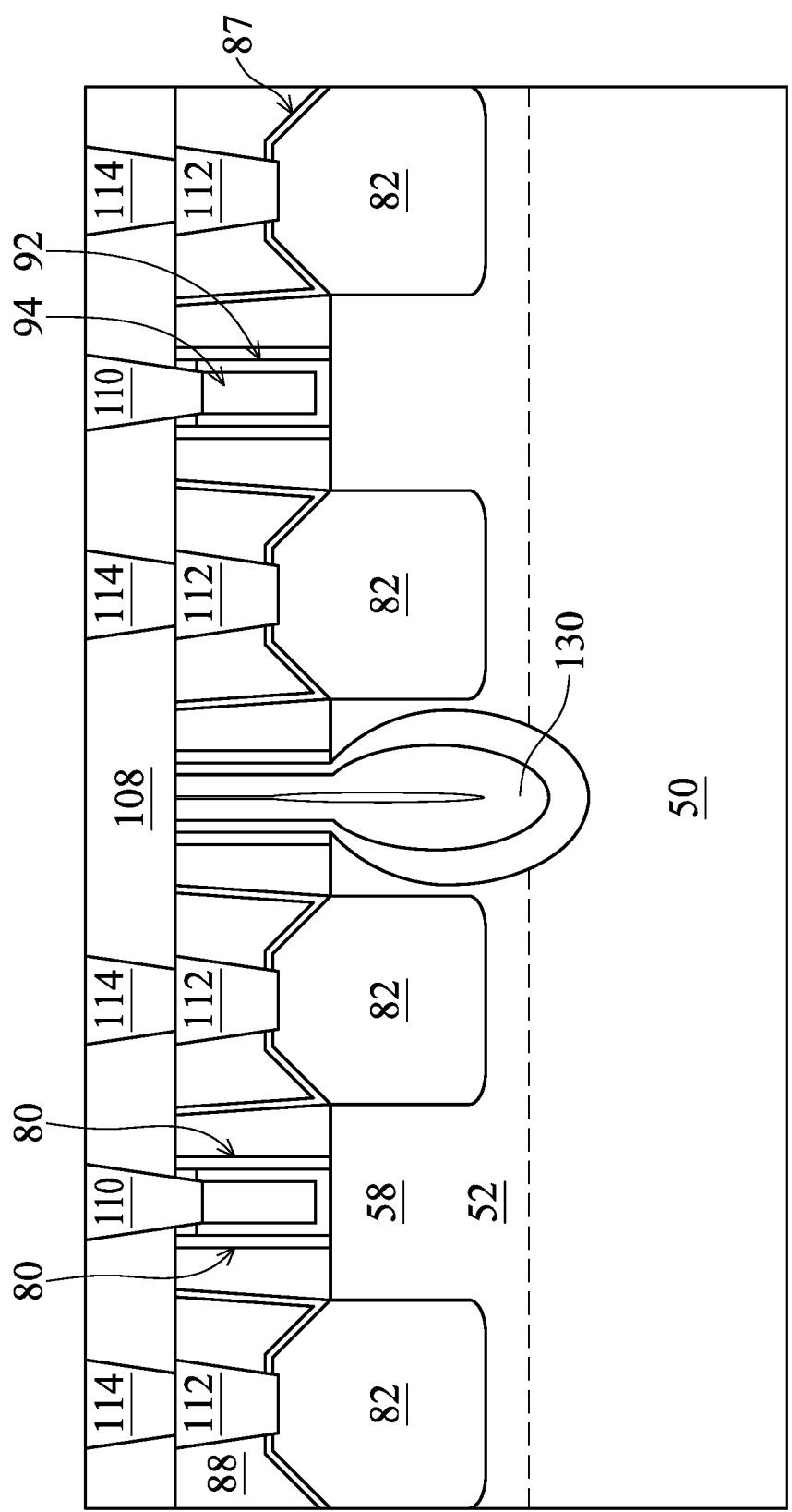

In FIGS. 22A and 22B, gate contacts 110 and second level source/drain contacts 114 are formed through the second ILD 108 in accordance with some embodiments. Openings for the source/drain contacts 114 are formed through the second ILD 108 to the first level source/drain contacts 112, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 114 and gate contacts 110 in the openings. The source/drain contacts 114 are physically and electrically coupled to the source/drain contacts 112, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts. Further, materials selected for the source/drain contacts 114 may be the same or different from a material of the source/drain contacts 112 and/or the gate contacts 110. Thus, finFET devices are formed in the semiconductor device 100 with gate isolation structures 130 that separate adjacent gate stacks 92/94.

Figure 23A:
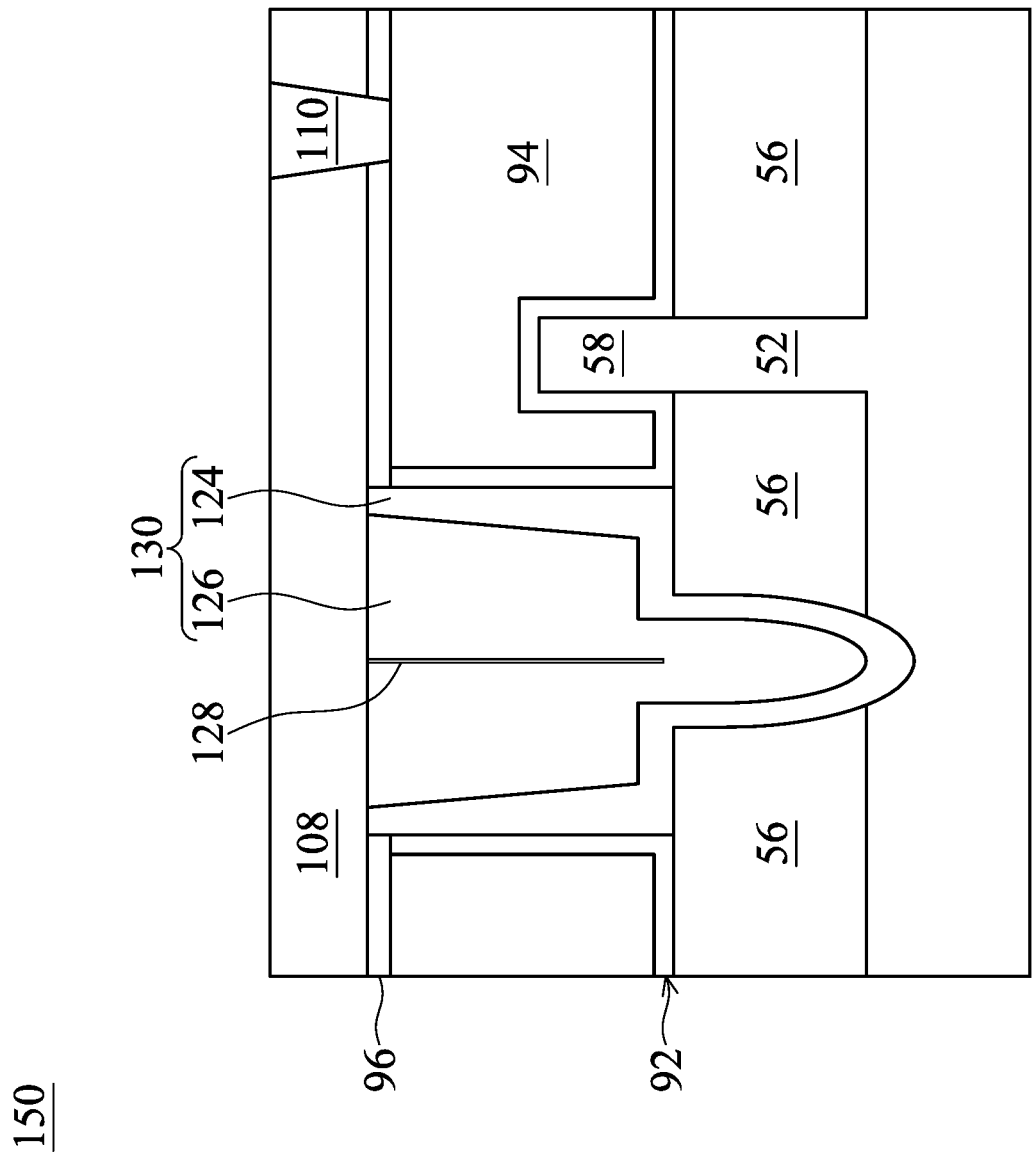
FIGS. 23A and 23B are cross-sectional views of FinFETs, in accordance with some embodiments.
Figure 23B:
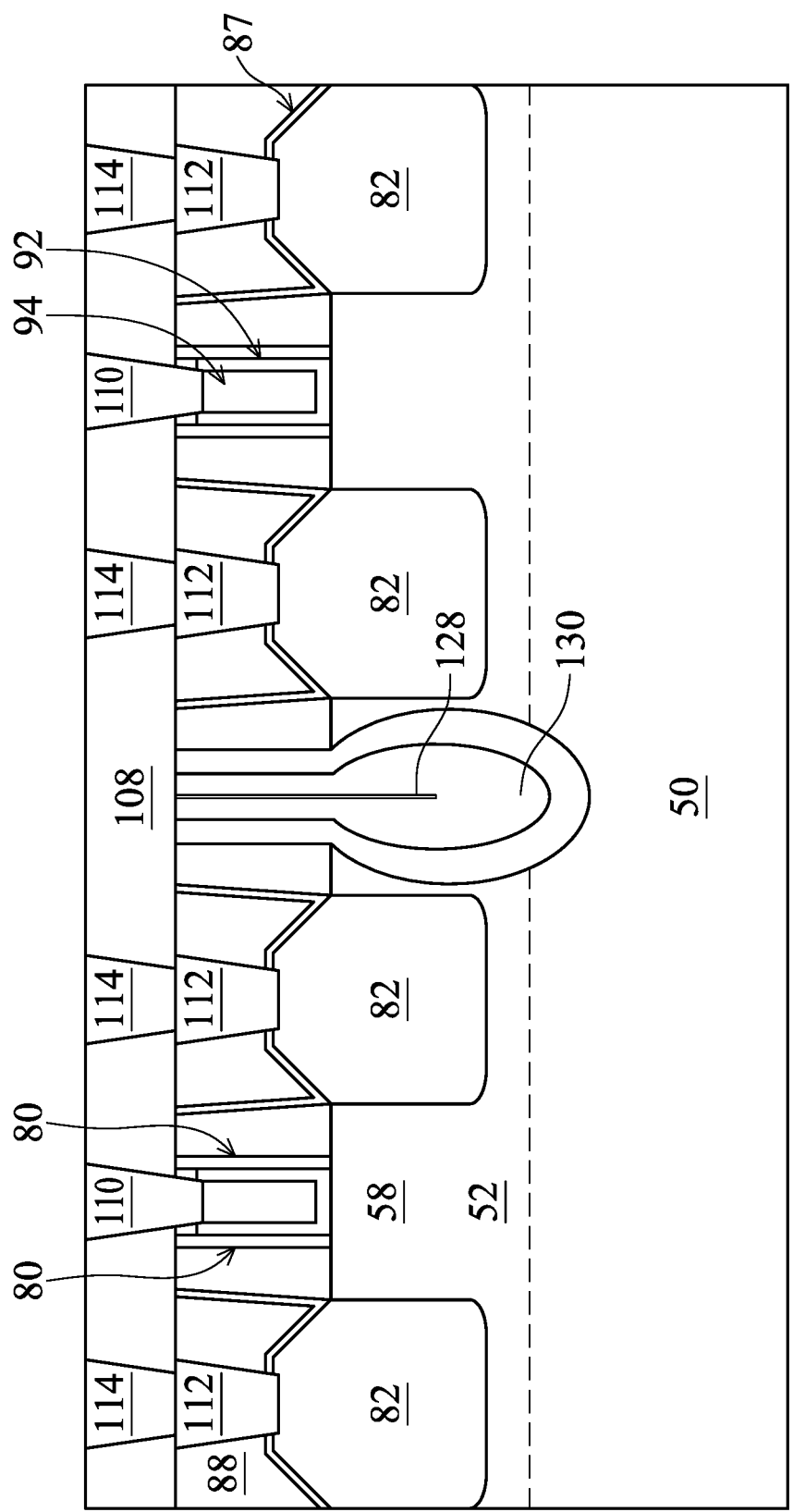

FIGS. 1 through 22B illustrates a particular configuration of the gate isolation structure 130. Other embodiments may include other configurations of the gate isolation structure 130. For example, FIGS. 23A and 23B illustrate a device 150 according to some embodiments. FIG. 23A illustrates a view along the cross-section A-A of FIG. 1 and through a gate isolation structure 130, and FIG. 23B illustrates a view along the cross-section B-B of FIG. 1 and through the gate isolation structure 130. The device 150 may be similar to the device 100 where like reference numerals indicate like elements formed by like processes. However, unlike the device 100 which includes voids 128' in lower portions of the seam 128, the gate isolation structures 130 in the device 150 are free of the voids 128'. The voids 128' may be omitted, for example, by controlling a deposition process of forming the dielectric fill material 126 and/or controlling aspect ratios of the openings into which the dielectric fill material 126 is deposited. The seam 128 may have a relatively small lateral dimension to achieve the benefits described above.

Figure 24A:
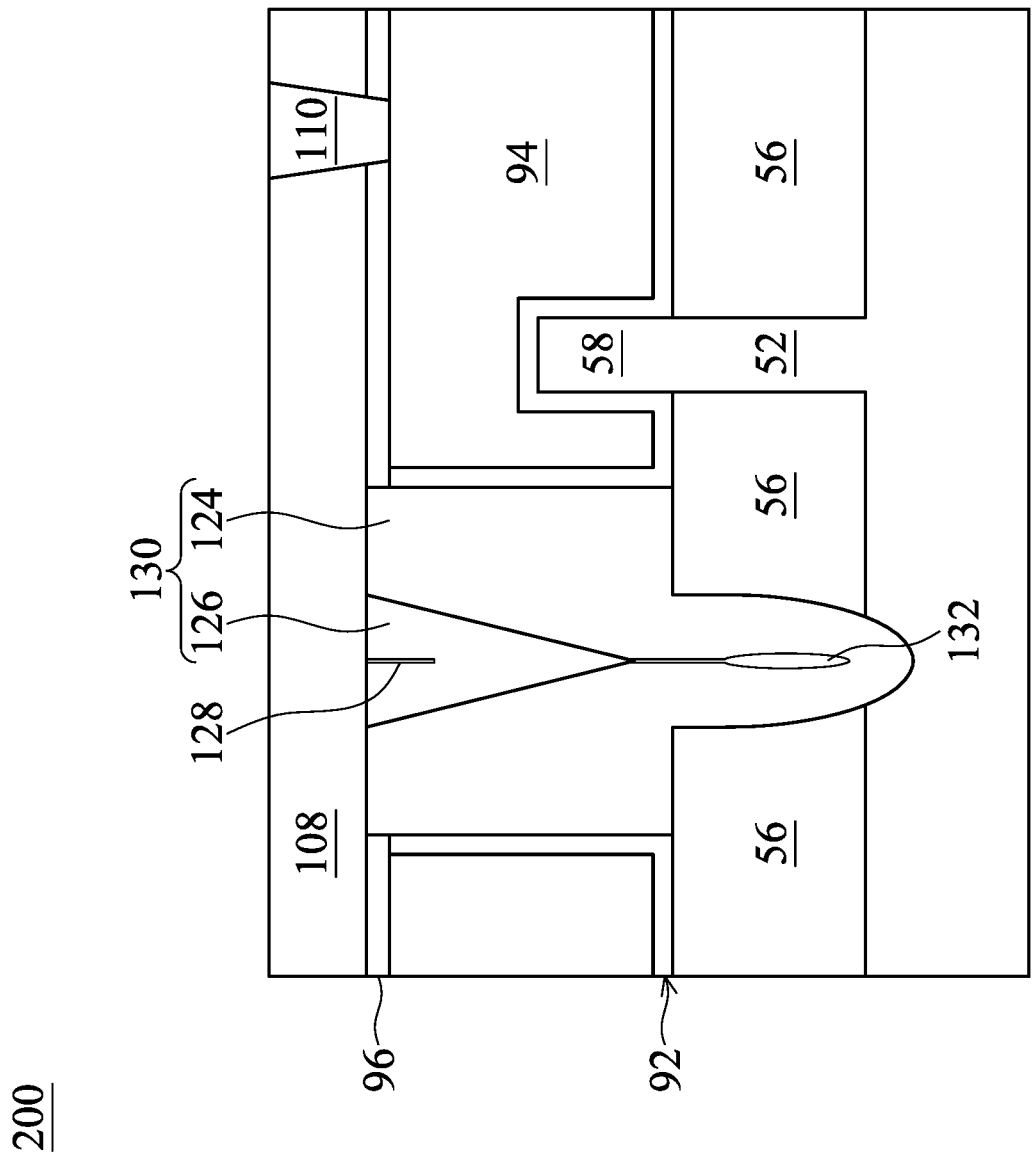
FIGS. 24A and 24B are cross-sectional views of FinFETs, in accordance with some embodiments.
Figure 24B:
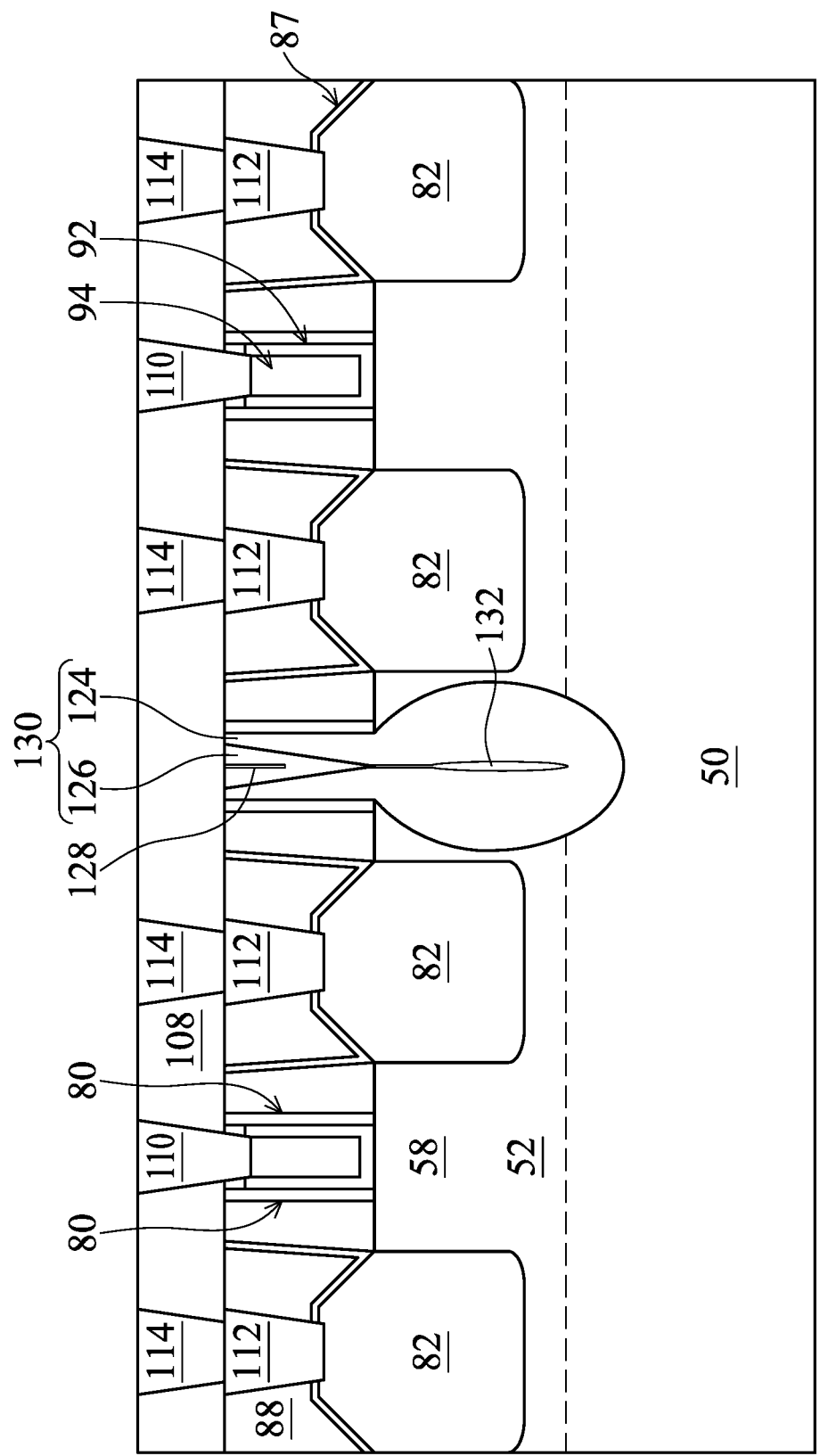

As another example, FIGS. 24A and 24B illustrate a device 200 according to some embodiments. FIG. 24A illustrates a view along the cross-section A-A of FIG. 1 and through a gate isolation structure 130, and FIG. 24B illustrates a view along the cross-section B-B of FIG. 1 and through the gate isolation structure 130. The device 200 may be similar to the device 100 where like reference numerals indicate like elements formed by like processes. However, unlike the device 100 where the dielectric liner 124 remains unmerged, the gate isolation structures 130 in the device 200 may include a merged, dielectric liner 124 that extends continuously from a sidewall of a first gate stack to a sidewall of a second gate stack. Specifically, a lower portion of the dielectric liner 124 (e.g., a portion disposed in the fin 52, the substrate 50, and the STI region 56) may merge together at a top surface of the fin 52/the STI region 56. The lower portion of the dielectric liner 124 may further include a void 132, which is formed as a result of the merging. The fill material 126 may be disposed over the merged, lower portion of the dielectric liner 124, and the fill material 126 may include the seam 128 having relatively small lateral dimensions to achieve the benefits described above.

Figure 25A:
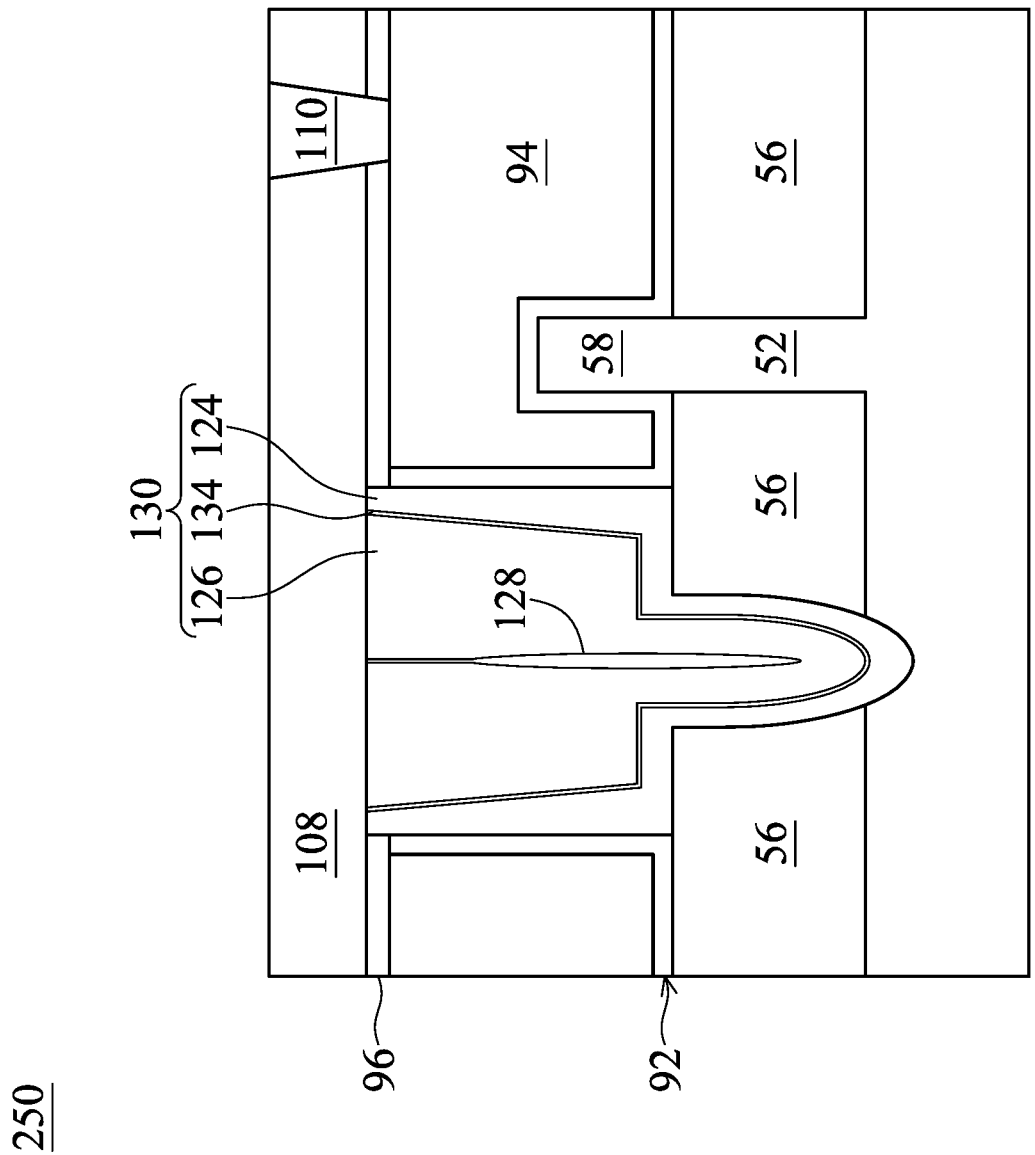
FIGS. 25A and 25B are cross-sectional views of FinFETs, in accordance with some embodiments.
Figure 25B:
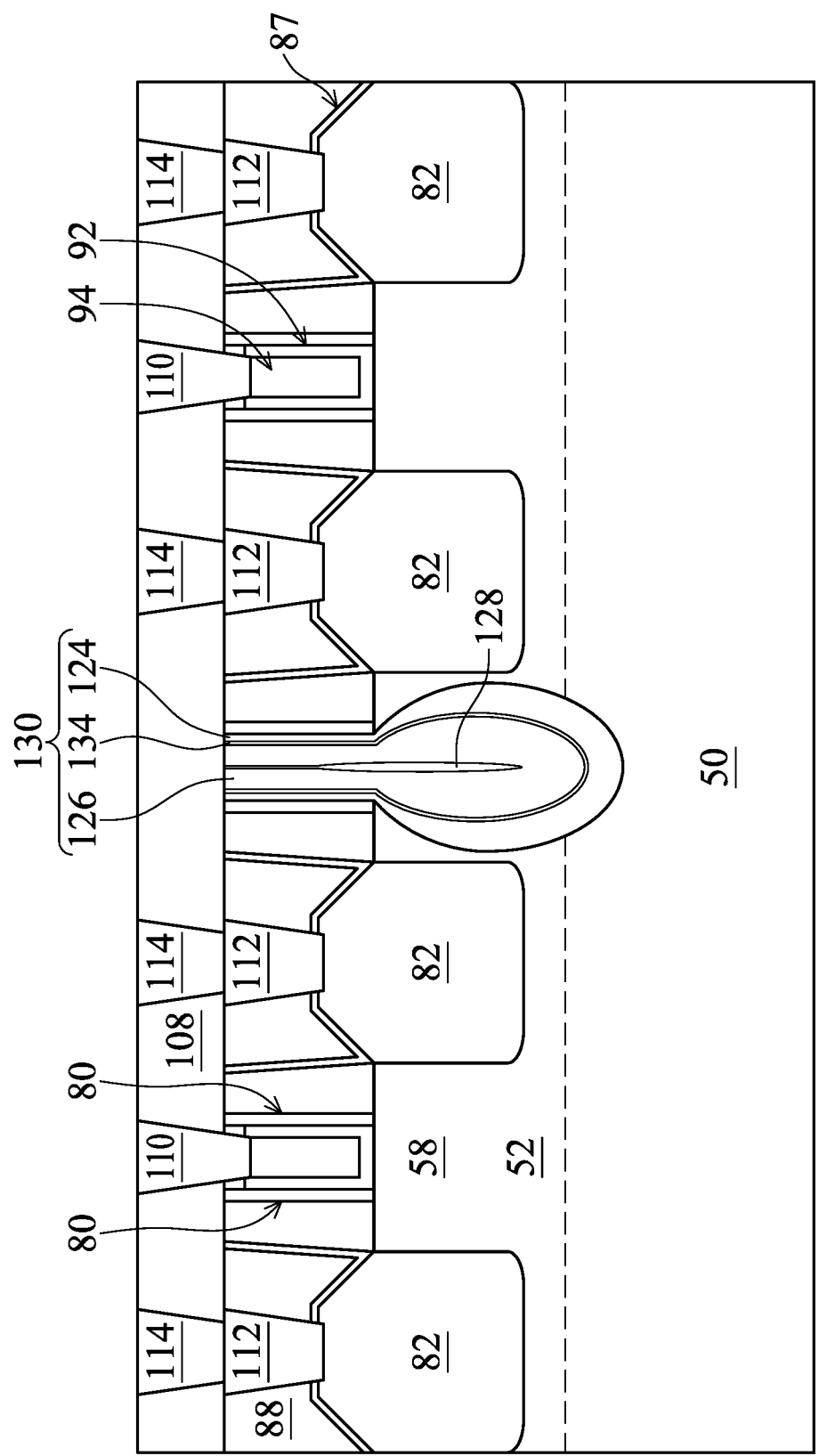

As another example, FIGS. 25A and 25B illustrate a device 250 according to some embodiments. FIG. 25A illustrates a view along the cross-section A-A of FIG. 1 and through a gate isolation structure 130, and FIG. 25B illustrates a view along the cross-section B-B of FIG. 1 and through the gate isolation structure 130. The device 250 may be similar to the device 100 where like reference numerals indicate like elements formed by like processes. However, unlike the device 100 where the dielectric liner 124 directly contacts the dielectric fill material 126, the gate isolation structure 130 in the device 250 may further include an additional dielectric liner 134 between the dielectric liner 124 and the dielectric fill material 126. In some embodiments, the dielectric liner 134 may include an oxide material, such as an oxide of the material of the dielectric liner 124. For example, when the dielectric liner 124 comprises silicon nitride, the dielectric liner 134 may comprise silicon oxynitride. The dielectric liner 134 may be a native oxide that is formed as a result of exposing the dielectric liner 124 to an atmosphere environment, thereby oxidizing the dielectric liner 124. In some embodiments, the dielectric liner 124 may be exposed to atmosphere while transferring the device 250 between deposition tools (e.g., a PEALD tool used to deposit the dielectric liner 124 and an ALD tool used to deposit the dielectric fill material 126). Other liner materials are also possible for the dielectric liner 124.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. Gate isolation structures are also formed to extend through the dummy gate stacks as described above. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Figure 26:
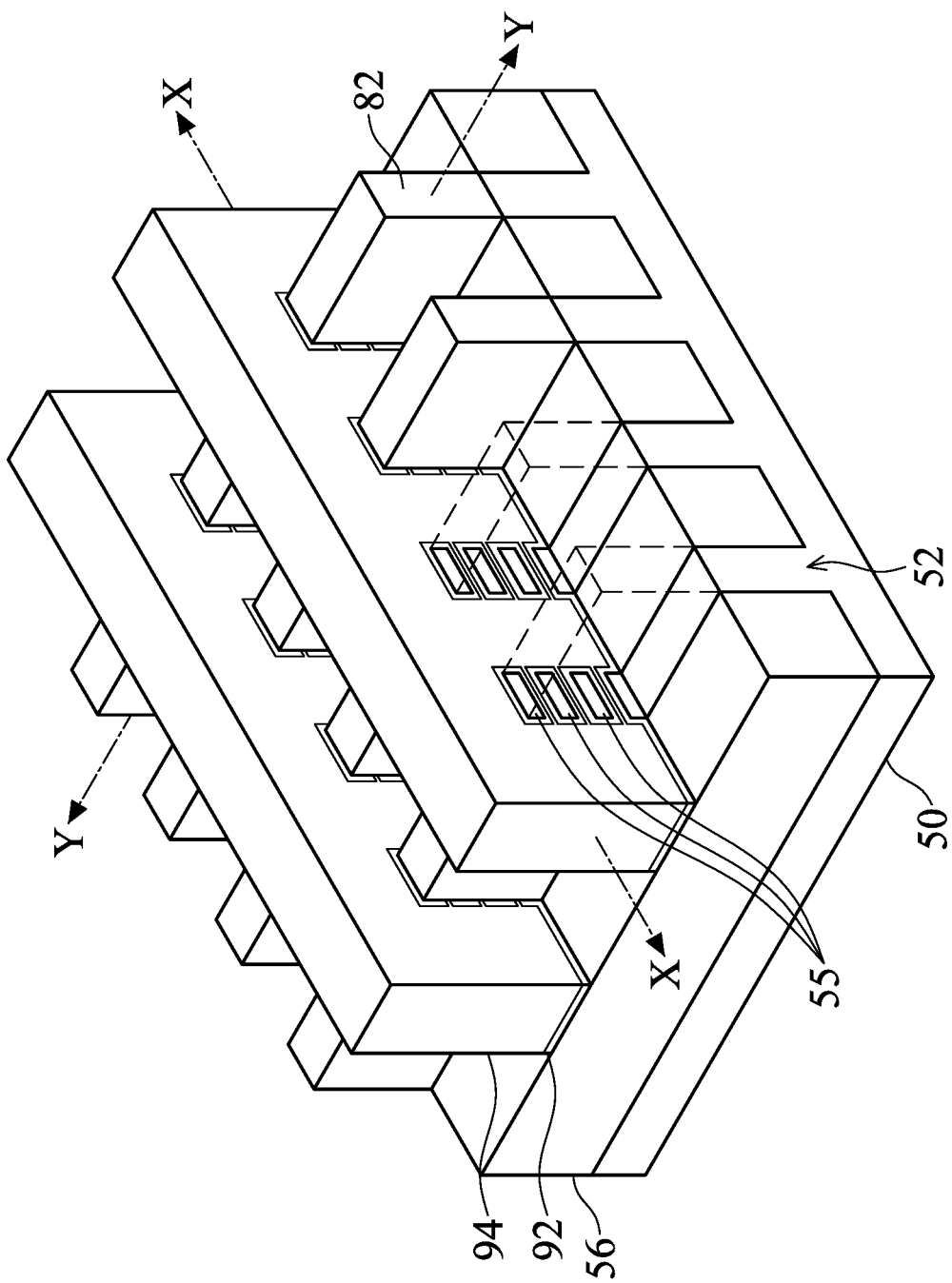
FIGS. 26, 27A, and 27B are cross-sectional views of NSFETs, in accordance with some embodiments.
Figure 27A:
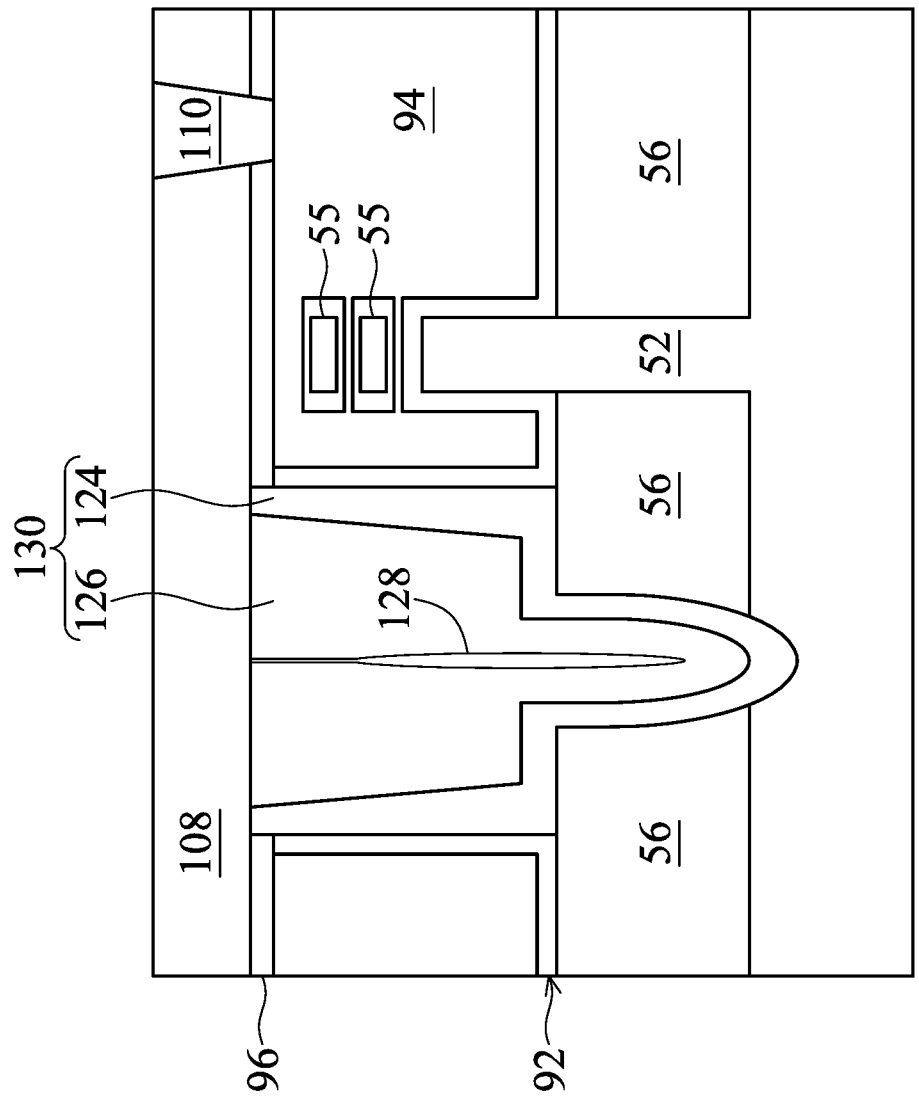
Figure 27B:
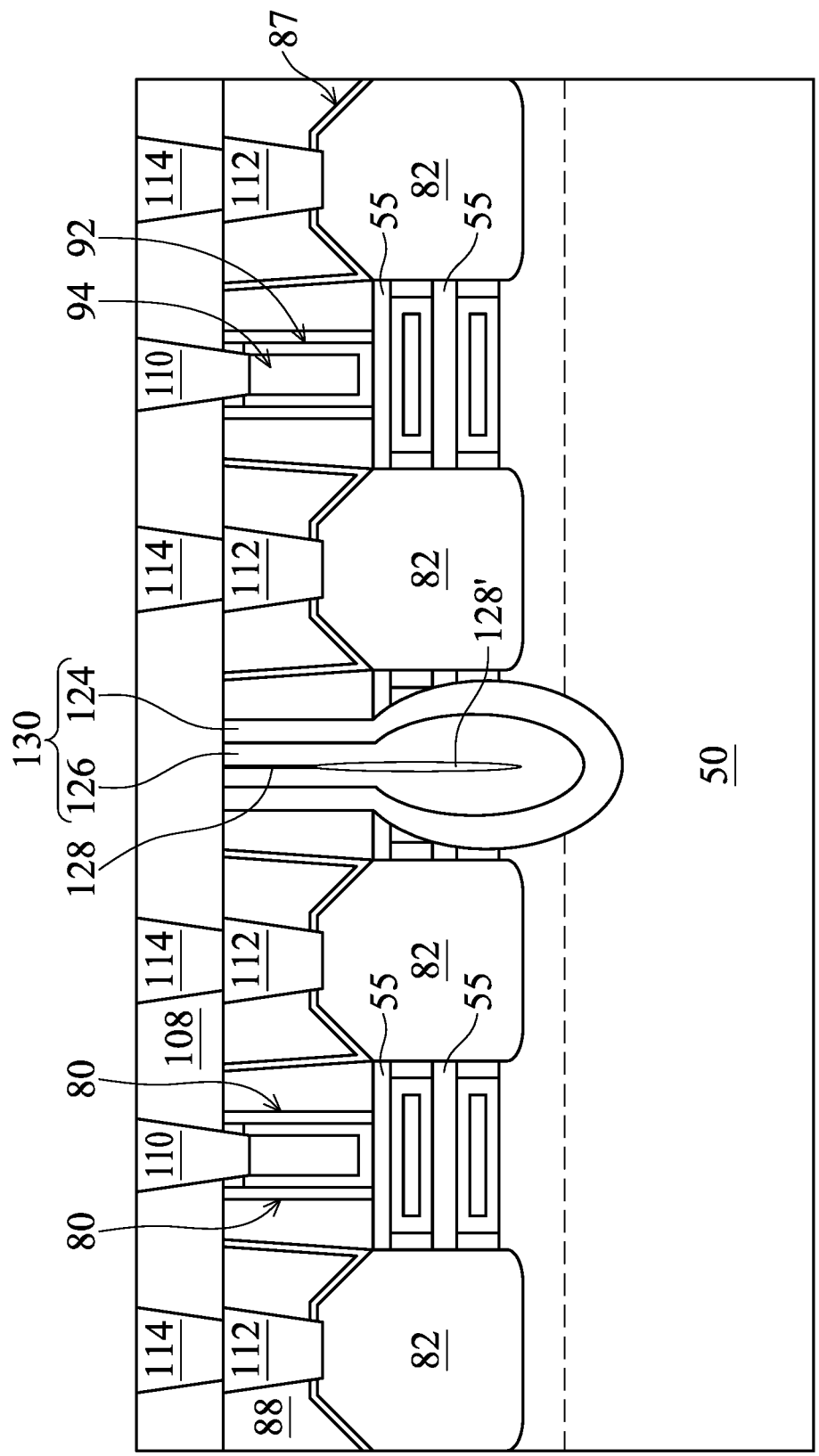

FIG. 26 illustrates a perspective view of a NSFET according to some embodiments. FIGS. 27A and 27B illustrate cross-sectional views of various embodiment gate isolation structures 130 in a NSFET context. Referring to FIG. 26, NSFET devices comprise nanostructures 55 (e.g., nanosheets, nanowire, or the like) over fins 52 on a substrate 50 (e.g., a semiconductor substrate), wherein the nanostructures 55 act as channel regions for the NSFET devices. The nanostructure 55 may include p-type nanostructures, n-type nanostructures, or a combination thereof. The STI regions 56 are disposed between adjacent fins 52, which may protrude above and from between neighboring STI regions 56. The gate dielectric material 92 is over top surfaces of the fins 52 and along top surfaces, sidewalls, and bottom surfaces of the nanostructures 55. Gate electrodes 94 are over the gate dielectric material 92. Epitaxial source/drain regions 82 are disposed on the fins 52 on opposing sides of the gate stacks 92/94.

FIG. 23 further illustrates reference cross-sections that are used in later figures. Cross-section X-X is along a longitudinal axis of a gate electrode 94 and in a direction, for example, perpendicular to the direction of current flow between the epitaxial source/drain regions 82 of a NSFET devices. Cross-section Y-Y is perpendicular to cross-section X-X and is parallel to a longitudinal axis of a fin 52 of the NSFET devices and in a direction of, for example, a current flow between the epitaxial source/drain regions 82 of the NSFET devices. FIG. 27A illustrates an embodiment NSFET device incorporating a gate isolation structure 130 (e.g., as described above in FIGS. 1 through 22B) along the cross-section X-X of FIG. 26, and FIG. 27B illustrates the NSFET device incorporating the gate isolation structure 130 along the cross-section Y-Y of FIG. 26. Various features of FIGS. 26 through 27B may be similar to those described above in FIGS. 1 through 22B where like reference numerals indicate like elements formed by like processes. FIGS. 27A and 27B illustrate the gate isolation structures 130 in a NSFET device context. Although FIGS. 27A and 27B illustrate gate isolation structures 130 according the device 100 described above, other embodiments may include gate isolation structures 130 according to any of the devices 150, 200, or 250 described above.

In various embodiments, a gate isolation structure may include a dielectric liner (sometimes referred to as a spacer), which is deposited using a non-conformal deposition process with a tapered profile, and the gate isolation structure may further include a dielectric fill material that is deposited over the dielectric liner. By maintaining a tapered profile in the dielectric liner, a width at a top of the opening may remain relatively large, and a deposition window of the dielectric fill material is improved. As such, the dielectric fill material may be formed with fewer manufacturing errors, such as reduced seams/voids. The reduction in size/number of seams/voids may further reduce electrical defects (e.g., shorting) that might otherwise result from a conductive material being inadvertently trapped in exposed seams during subsequent processing steps (e.g., during the formation of gate or source/drain contacts).

In some embodiments, a semiconductor device includes a first transistor having a first gate stack and first source/drain regions on opposing sides of the first gate stack; a second transistor having a second gate stack and second source/drain regions on opposing sides of the second gate stack; a gate isolation structure separating the first gate stack from the second gate stack, wherein the gate isolation structure comprises: a dielectric liner having a varied thickness along sidewalls of the first gate stack and the second gate stack; and a dielectric fill material over the dielectric liner, wherein the dielectric fill material comprises a seam. Optionally, in some embodiments, the dielectric liner has a lateral portion along a bottom surface of dielectric fill material, wherein the varied thickness of the dielectric liner increases in a direction towards the lateral portion of the dielectric liner. Optionally, in some embodiments, a void is disposed in a lower portion of the seam, wherein the void is wider than an upper portion of the seam. Optionally, in some embodiments, the semiconductor device further includes a second dielectric liner between the dielectric liner and the dielectric fill material. Optionally, in some embodiments, the dielectric liner comprises a first dielectric material, and the second dielectric liner comprises an oxide of the first dielectric material. Optionally, in some embodiments, the dielectric liner extends continuously from a sidewall of the first gate stack to a sidewall of the second gate stack. Optionally, in some embodiments, the semiconductor device further includes a void in a lower portion of the dielectric liner.

In some embodiments, a semiconductor device includes a first gate stack in an interlayer dielectric; a second gate stack in the interlayer dielectric; and a gate isolation structure between the first gate stack and the second gate stack, wherein the gate isolation structure contacts a sidewall of the first gate stack and a sidewall of the second gate stack, wherein the gate isolation structure comprises: a dielectric liner, wherein a first lateral dimension of the dielectric liner is less than a second lateral dimension of the dielectric liner, wherein the first lateral dimension of the dielectric liner is measured at a level of a top surface of the interlayer dielectric, wherein the second lateral dimension of the dielectric liner is measured at a level of a bottom surface of the interlayer dielectric; and a dielectric fill material over the dielectric liner, wherein the dielectric fill material comprises a seam. Optionally, in some embodiments, a first lateral dimension of the dielectric fill material is greater than a second lateral dimension of the dielectric fill material, wherein the first lateral dimension of the dielectric fill material is measured at the level of the top surface of the interlayer dielectric, wherein the second lateral dimension of the dielectric fill material is measured at the level of the bottom surface of the interlayer dielectric. Optionally, in some embodiments, a ratio of the second lateral dimension of the dielectric fill material to the first lateral dimension of the dielectric fill material is in a range of 0.7 to 0.9. Optionally, in some embodiments, a third lateral dimension of the dielectric fill material is greater than the first lateral dimension of the dielectric fill material and the second lateral dimension of the dielectric fill material, wherein the third lateral dimension measured at a widest point of the dielectric fill material in a cross-sectional view, and wherein the third lateral dimension is measured at a level below the bottom surface of the interlayer dielectric. Optionally, in some embodiments, a ratio of the second lateral dimension of the dielectric fill material to the third lateral dimension of the dielectric fill material is in a range of 0.4 to 0.6. Optionally, in some embodiments, the seam includes an upper portion and a lower portion, wherein the lower portion has void with a larger lateral dimension than the upper portion. Optionally, in some embodiments, a ratio of the second lateral dimension of the dielectric liner to the first lateral dimension of the dielectric liner is in a range of 1.1 to 1.5.

In some embodiments, a method includes patterning an opening extending through a dummy gate stack; depositing a dielectric liner on sidewalls and a bottom surface of the opening, wherein depositing the dielectric liner comprises a non-conformal deposition process; depositing a dielectric fill material in the opening over the dielectric liner, wherein depositing the dielectric fill material comprises a different type of deposition process than depositing the dielectric liner, and wherein depositing the dielectric fill material comprises forming a seam in the dielectric fill material; removing the dummy gate stack; and forming a first gate stack and a second gate stack on opposing sides of the dielectric liner. Optionally, in some embodiments, the non-conformal deposition process is a plasma enhanced atomic layer deposition (PEALD) process, wherein the PEALD process deposits the dielectric liner thinner at a top of the opening than at a bottom of the opening. Optionally, in some embodiments, depositing the dielectric fill material comprises an atomic layer deposition (ALD) process. Optionally, in some embodiments, the PEALD process comprises performing a nitrogen plasma treatment. Optionally, in some embodiments, the non-conformal deposition process comprises merging the dielectric liner at a lower portion of the opening. Optionally, in some embodiments, the method further includes prior to depositing the dielectric fill material, oxidizing the dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first transistor having a first gate stack and first source/drain regions on opposing sides of the first gate stack;
   a second transistor having a second gate stack and second source/drain regions on opposing sides of the second gate stack;
   a gate isolation structure separating the first gate stack from the second gate stack, wherein the gate isolation structure comprises:
      a dielectric liner having a varied thickness along sidewalls of the first gate stack and the second gate stack, wherein the dielectric liner extends continuously from a sidewall of the first gate stack to a sidewall of the second gate stack; and
      a dielectric fill material over the dielectric liner, wherein the dielectric fill material comprises a seam.

2. The semiconductor device of claim 1, wherein the dielectric liner has a lateral portion along a bottom surface of dielectric fill material, wherein the varied thickness of the dielectric liner increases in a direction towards the lateral portion of the dielectric liner.

3. The semiconductor device of claim 1, wherein a void is disposed in a lower portion of the seam, wherein the void is wider than an upper portion of the seam.

4. The semiconductor device of claim 1, wherein further comprising a second dielectric liner between the dielectric liner and the dielectric fill material.

5. The semiconductor device of claim 4, wherein the dielectric liner comprises a first dielectric material, and the second dielectric liner comprises an oxide of the first dielectric material.

6. The semiconductor device of claim 1, further comprising a void in a lower portion of the dielectric liner.

7. A semiconductor device comprising:
   a first gate stack in an interlayer dielectric;
   a second gate stack in the interlayer dielectric; and
   a gate isolation structure between the first gate stack and the second gate stack, wherein the gate isolation structure contacts a sidewall of the first gate stack and a sidewall of the second gate stack, wherein the gate isolation structure comprises:
      a dielectric liner, wherein a first lateral dimension of the dielectric liner is less than a second lateral dimension of the dielectric liner, wherein the first lateral dimension of the dielectric liner is measured at a level of a top surface of the interlayer dielectric, wherein the second lateral dimension of the dielectric liner is measured at a level of a bottom surface of the interlayer dielectric; and
      a dielectric fill material over the dielectric liner, wherein the dielectric fill material comprises a seam, wherein the dielectric liner separates the dielectric fill material from the first gate stack and the second gate stack.

8. The semiconductor device of claim 7, wherein a first lateral dimension of the dielectric fill material is greater than a second lateral dimension of the dielectric fill material, wherein the first lateral dimension of the dielectric fill material is measured at the level of the top surface of the interlayer dielectric, wherein the second lateral dimension of the dielectric fill material is measured at the level of the bottom surface of the interlayer dielectric.

9. The semiconductor device of claim 8, wherein a ratio of the second lateral dimension of the dielectric fill material to the first lateral dimension of the dielectric fill material is in a range of 0.7 to 0.9.

10. The semiconductor device of claim 8, wherein a third lateral dimension of the dielectric fill material is greater than the first lateral dimension of the dielectric fill material and the second lateral dimension of the dielectric fill material, wherein the third lateral dimension measured at a widest point of the dielectric fill material in a cross-sectional view, and wherein the third lateral dimension is measured at a level below the bottom surface of the interlayer dielectric.

11. The semiconductor device of claim 10, wherein a ratio of the second lateral dimension of the dielectric fill material to the third lateral dimension of the dielectric fill material is in a range of 0.4 to 0.6.

12. The semiconductor device of claim 7, wherein the seam includes an upper portion and a lower portion, wherein the lower portion has a void with a larger lateral dimension than the upper portion.

13. The semiconductor device of claim 7, wherein a ratio of the second lateral dimension of the dielectric liner to the first lateral dimension of the dielectric liner is in a range of 1.1 to 1.5.

14. A method comprising:
    patterning an opening extending through a dummy gate stack;
    depositing a dielectric liner on sidewalls and a bottom surface of the opening, wherein depositing the dielectric liner comprises a non-conformal deposition process;
    depositing a dielectric fill material in the opening over the dielectric liner, wherein depositing the dielectric fill material comprises a different type of deposition process than depositing the dielectric liner, and wherein depositing the dielectric fill material comprises forming a seam in the dielectric fill material;
    removing the dummy gate stack to define a first gate opening and a second gate opening, the first gate opening and the second gate opening being disposed on opposing sides of the dielectric liner; and
    forming a first gate stack in the first gate opening and a second gate stack in the second gate opening such that the first gate stack and the second gate stack each physically contact the dielectric liner.

15. The method of claim 14, wherein the non-conformal deposition process is a plasma enhanced atomic layer deposition (PEALD) process, wherein the PEALD process deposits the dielectric liner thinner at a top of the opening than at a bottom of the opening.

16. The method of claim 15, wherein depositing the dielectric fill material comprises an atomic layer deposition (ALD) process.

17. The method of claim 15, wherein the PEALD process comprises performing a nitrogen plasma treatment.

18. The method of claim 14, wherein the non-conformal deposition process comprises merging a first portion of the dielectric liner with a second portion of the dielectric liner at a lower portion of the opening.

19. The method of claim 14 further comprising prior to depositing the dielectric fill material, oxidizing the dielectric liner.

20. The method of claim 14, wherein depositing the dielectric fill material comprises depositing the dielectric fill material to be wider at a top of the opening than at a bottom of the opening.

* * * * *